United States Patent
Salcedo et al.

(10) Patent No.: US 9,171,832 B2
(45) Date of Patent: Oct. 27, 2015

(54) ANALOG SWITCH WITH HIGH BIPOLAR BLOCKING VOLTAGE IN LOW VOLTAGE CMOS PROCESS

(71) Applicant: Analog Devices, Inc., Norwood, MA (US)

(72) Inventors: Javier Alejandro Salcedo, North Billerica, MS (US); Karl Sweetland, Tyngsborough, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 13/902,729

(22) Filed: May 24, 2013

(65) Prior Publication Data

US 2014/0346563 A1    Nov. 27, 2014

(51) Int. Cl.
*H02H 9/04* (2006.01)
*H01L 21/331* (2006.01)
(Continued)

(52) U.S. Cl.
CPC ........ *H01L 27/0262* (2013.01); *H01L 29/7436* (2013.01)

(58) Field of Classification Search
CPC . H01L 27/0262; H01L 29/87; H01L 29/7436; H01L 27/0259; H01L 29/747; H01L 23/60; H01L 29/735; H01L 27/0248; H01L 27/0277; H01L 27/0292; H01L 29/0821; H01L 29/66386; H01L 2924/3025; H01L 29/74; H01L 21/8249
USPC .................................................. 257/168–178
See application file for complete search history.

(56) References Cited

U.S. PATENT DOCUMENTS 3,436,667 A    4/1969  Kedson
4,633,283 A   12/1986  Avery
(Continued)

FOREIGN PATENT DOCUMENTS

DE    10 2007 040 875 A1    3/2009
EP         0 168 678 A2    1/1986
(Continued)

OTHER PUBLICATIONS

Anderson et al., *ESD Protection under Wire Bonding Pads*, EOS/ESD Symposium 99-88, pp. 2A.4.1-2A.4.7 (1999).
(Continued)

*Primary Examiner* — Marcos D. Pizarro
*Assistant Examiner* — Nelson Garces
(74) *Attorney, Agent, or Firm* — Knobbe, Martens, Olson & Bear LLP

(57) ABSTRACT

The disclosed technology relates to an apparatus for protection against transient electrical events. In one aspect, the apparatus includes an analog switch with high bipolar blocking voltage comprising a first p-type well region, a second p-type well region, a first n-type well region disposed between the first and second p-type well regions, and a deep n-type well region surrounding the first p-type well region, the second p-type well region, and the first n-type well region. The apparatus additionally includes a first native n-type region disposed between the first p-type well region the n-type well region and a second native n-type region disposed between the second p-type well region and n-type well region. The apparatus is configured such that the first p-type well region serves as an emitter/collector of a bidirectional PNP bipolar transistor. In addition, the apparatus is configured such that the first native n-type region, the first n-type well region, and the second native n-type region serves as a base of the bidirectional PNP bipolar transistor. Furthermore, the apparatus is configured such that the second p-type well region is configured as a collector/emitter of the bidirectional PNP bipolar transistor.

25 Claims, 13 Drawing Sheets

(51) Int. Cl.
*H01L 29/73* (2006.01)
*H02H 9/00* (2006.01)
*H01L 21/8222* (2006.01)
*H01L 27/06* (2006.01)
*H01L 27/02* (2006.01)
*H01L 29/74* (2006.01)

(56) References Cited

U.S. PATENT DOCUMENTS

| | | |
|---|---|---|
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,652,689 A | 7/1997 | Yuan |
| 5,663,860 A | 9/1997 | Swonger |
| 5,742,084 A | 4/1998 | Yu |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,840 A | 4/1999 | Ohuchi et al. |
| 5,895,940 A | 4/1999 | Kim |
| 5,998,813 A | 12/1999 | Bernier |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,768,616 B2 | 7/2004 | Mergens et al. |
| 6,870,202 B2 | 3/2005 | Oka |
| 6,960,792 B1 | 11/2005 | Nguyen |
| 7,034,363 B2 | 4/2006 | Chen |
| 7,038,280 B2 | 5/2006 | Righter |
| 7,071,528 B2 | 7/2006 | Ker et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,368,116 B2 | 2/2013 | Salcedo et al. |
| 8,432,651 B2 | 4/2013 | Salcedo et al. |
| 8,466,489 B2 | 6/2013 | Salcedo et al. |
| 2001/0040254 A1 | 11/2001 | Takiguchi |
| 2002/0021538 A1 | 2/2002 | Chen et al. |
| 2002/0109190 A1 | 8/2002 | Ker et al. |
| 2002/0122280 A1* | 9/2002 | Ker et al. .......... 361/56 |
| 2002/0187601 A1 | 12/2002 | Lee et al. |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0151160 A1 | 7/2005 | Salcedo et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2007/0007545 A1 | 1/2007 | Salcedo et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1* | 7/2011 | Gendron et al. ........... 361/56 |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1* | 1/2012 | Salcedo ................ 361/56 |
| 2012/0199874 A1 | 8/2012 | Salcedo et al. |
| 2012/0205714 A1 | 8/2012 | Salcedo et al. |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0242448 A1 | 9/2013 | Salcedo et al. |
| 2013/0270605 A1 | 10/2013 | Salcedo et al. |

FOREIGN PATENT DOCUMENTS

| | | |
|---|---|---|
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications*, IEEE Xplore, downloaded Feb. 23, 2010 at 12:53 Est, 4 pages.

Salcedo et al., *Bidirectional Devices for Automotive-Grade Electrostatic Discharge Applications*, IEEE Electron Device Letters, vol. 33, No. 6, Jun. 2012, 3 pages.

Salcedo et al., *On-Chip Protection for Automotive Integrated Circuits Robustness*, IEEE 2012 8th International Caribbean Conference on Devices, Circuits and Systems (ICCDCS), 5 pages (2012).

* cited by examiner

ANALOG SWITCH WITH HIGH BIPOLAR BLOCKING VOLTAGE IN LOW VOLTAGE CMOS PROCESS

BACKGROUND OF THE INVENTION

1. Field

The disclosed technology relates to electronics, and more particularly, to bipolar blocking voltage switch devices that protect circuits from transient electrical events such as electrical overstress/electrostatic discharge.

2. Description of the Related Technology

Certain electronic systems can be exposed to transient electrical events that last a relatively short duration and have rapidly changing voltages and/or currents. Transient electrical events can include, for example, electrostatic discharge (ESD) or electromagnetic interference events arising from the abrupt release of charge from an object or person to an electronic system.

Transient electrical events can damage integrated circuits (ICs) inside an electronic system due to overvoltage conditions and/or high levels of power dissipation over relatively small areas of the ICs. This rapid and high dissipation of power can potentially lead to damages to core circuits, resulting in gate oxide punch-through, junction damage, metal damage, and surface charge accumulation, among other damaging phenomena. Moreover, transient electrical events can induce latch-up (in other words, inadvertent creation of a low-impedance path), thereby disrupting the functioning of the IC and potentially causing permanent damage to the IC.

SUMMARY

The disclosed technology relates to an apparatus for protection against transient electrical events. In one aspect, the apparatus provided on a p-type substrate includes an analog switch with high bipolar blocking voltage comprising a first p-type well region, a second p-type well region, a first n-type well region disposed between the first and second p-type well regions and a deep n-type well region underneath the first p-type well region, the second p-type well region, and the first n-type well region. The apparatus additionally includes a first native n-type region disposed between the first p-type well region the n-type well region and a second native n-type region disposed between the second p-type well region and n-type well region. The apparatus is configured such that the first p-type well region serves as an emitter/collector of a bidirectional PNP bipolar transistor. In addition, the first native n-type region, the first n-type well region, and the second native n-type region are configured to serve as a base of the bidirectional PNP bipolar transistor. Furthermore, the second p-type well region is configured to serve as a collector/emitter of the bidirectional PNP bipolar transistor.

DETAILED DESCRIPTION OF THE PREFERRED EMBODIMENT

Emerging integrated circuits (IC) for automotive and consumer electronics applications that are fabricated using low voltage CMOS processes increasingly use input/output interface pins that operate at relatively high bidirectional voltages. Applications of such ICs include, for example, digital audio codec platforms for automotive infotainment and simultaneous sampling analog-to-digital data acquisition systems. These ICs often operate in relatively harsh environments and should comply with applicable electrostatic discharge (ESD) and electromagnetic interference immunity (EMI) specifications. Relatively high ESD and EMI immunity can be desirable because the ICs can be subject to a wide range of high voltage transient electrical events that exceed ordinary operating conditions. For example, some digital audio codec platforms require ESD robustness in exceeding 8,000 V per IEC 61000-4-2 standard ESD specification and +/−12 V operating voltage. In addition, some analog-to-digital data acquisition systems fabricated using, for example, below 180 nm 5V mixed-signal CMOS processes, can have analog inputs operating at a bidirectional voltage range exceeding +/−16.5 V.

Various techniques can be employed to protect the main circuitry of the ICs against damaging transient electrical events such as ESD. Some systems employ external off-chip protection devices to ensure that core electronic systems are not damaged in response to the transient electrostatic and electromagnetic events. However, due to performance, cost, and spatial considerations, there is an increasing need for protection devices that are monolithically integrated with the main circuitry, that is, the circuitry to be protected.

Figure 1:
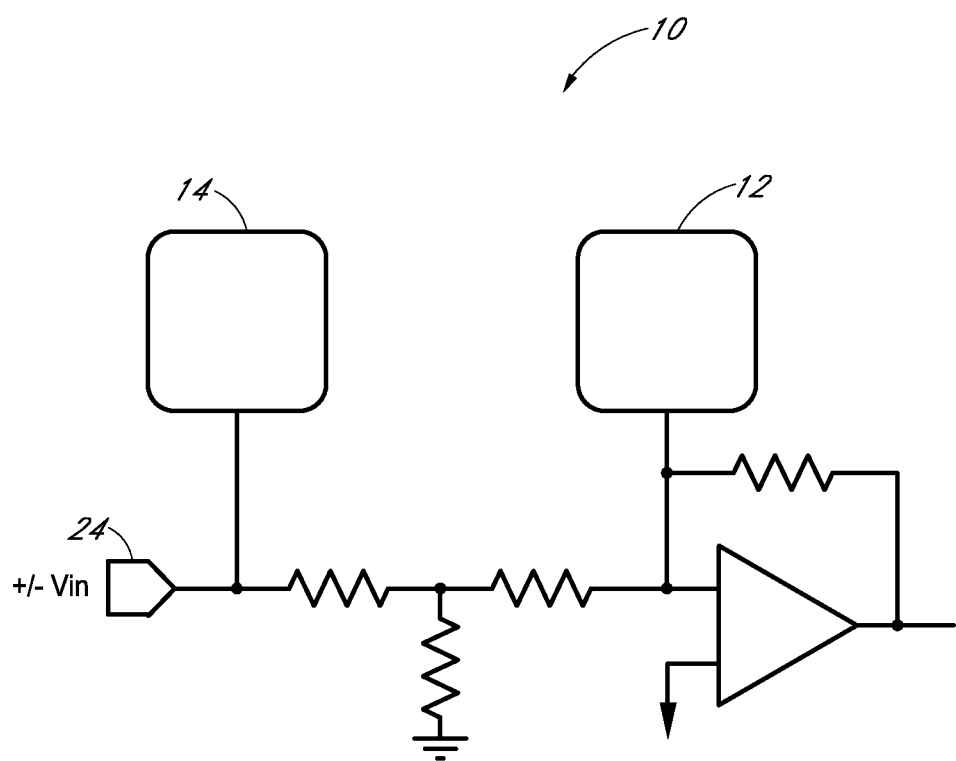
FIG. 1 is a schematic diagram of an example input interface which includes a primary protection device and a secondary protection device according to one embodiment.

FIG. 1 illustrates a schematic diagram of an example input interface 10 that can couple to main circuitry. The input interface 10 includes a primary protection device 14 and a secondary protection device 12. The input interface 10 includes an input 24 which can receive an incoming transient ESD/EMI stress. A primary protection device 14 can be configured to discharge a larger portion of the transient ESD/EMI stress and a secondary protection device 12 can be configured to discharge a smaller portion of the transient ESD/EMI. The primary protection device 14 can be, for example, a bidirectional protection device such as NPNPN or PNPNP bidirectional silicon-controlled rectifier (SCR) devices. Such bidirectional protection devices can maintain the output voltage level within a safe range by transitioning from a high-impedance state to a low-impedance state in response to a transient electrical event. In addition, the bidirectional protection devices can shunt a large portion of the current generated by the transient electrical event, thereby sparing the main circuitry from such an event. The secondary protection device 12 can provide protection against residual stress and can comprise a conventional diode up/down protection circuit with ground and supply references.

In one aspect, analog switch embodiments disclosed herein relate to a protection device for protecting main circuitry against transient electrical events such ESD/EMI stress events, similar to a primary protection device described in FIG. 1. Because different applications can use different levels of protection, customizability of various device parameters of the protection is desirable, such as the customizability of trigger voltage of the protection device, post-trigger holding voltage, and maximum shunt current, among others. In addition, because of the exposure to relatively high voltage, customization of the various device parameters should not lead to unintended breakdown of other parts of the protection device or core devices, such as parasitic devices formed through a common substrate.

Figure 2:
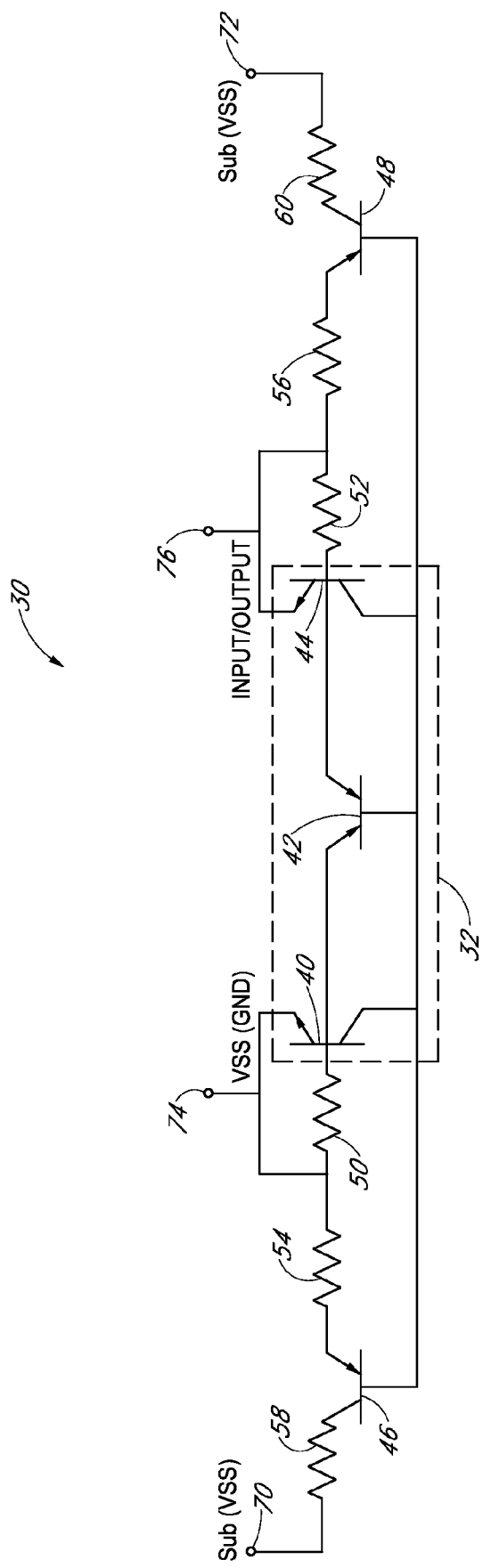
FIG. 2 is a schematic circuit diagram of an analog switch with high bipolar blocking voltage according to one embodiment.

FIG. 2 illustrates a schematic analog switch circuit 30 with high bipolar blocking voltage according to one embodiment. A high current shunt path is enabled by a first NPN bipolar transistor 40, the PNP bi-directional bipolar transistor 42, and a second NPN bipolar transistor 44 arranged in a silicon-controlled rectifier (SCR) configuration. That is, the first NPN bipolar transistor 40, the PNP bi-directional bipolar transistor 42, and the second NPN bipolar transistor 44 are arranged to form a bipolar NPNPN SCR device 32. The analog switch circuit 30 with high bipolar blocking voltage can be configured to provide a current shunt path through the bipolar NPNPN device 32 in response to an external transient electrical event that induces a voltage difference between the first and second pads 74 and 76 that exceeds a particular value. For example, the second pad 76 can be a signal pin or pad of an IC, and the first pad 74 can be a power low pin or pad, such as a pad associated with the power low voltage supply such as $V_{ss}$ or ground.

In one embodiment, the second pad 76 may configured as a transceiver I/O pad. The first pad 74 can be configured to be connected to a substrate of a transceiver circuit. The connection between the first pad 74 and the transceiver circuit substrate can be made through a high current power rail. The high current power rail typically has a relatively low resistance and be designed to handle a relatively large amount of current in response to a transient electrical event. The analog switch circuit 30 with high bipolar blocking voltage can further be connected to the substrate of the transceiver circuit at $V_{ss}$ or ground through first and second Kelvin connections 70 and 72. In comparison to the relatively high current power rail connection that connects the first pad 74 and the transceiver circuit substrate, first and second Kelvin connections 70 and 72 can be relatively high resistance paths, passing a relatively low amount of current flowing in response to the same transient electrical event that can be used to trigger a relatively large amount of current to pass through the high current power rail. Because both the first pad 74 and the first and second Kelvin connections 70 and 72 connect to the substrate of the transceiver circuit, which may be at $V_{ss}$ or ground, and there is no appreciable current flow between the analog switch circuit 30 with high bipolar blocking voltage and the substrate of the transceiver circuit under equilibrium conditions, the voltage potential at the first pad 74 and first and second Kelvin connections 70 and 72 are about the same. However, during a transient electrical event, because of the relatively high amount of current that flows between the analog switch circuit 30 with high bipolar blocking voltage and the substrate of the transceiver circuit via the high current power rail connected to the first pad 74, there can be a relatively large voltage drop that is developed along the high current power rail, which in turn can lead to a difference in potential between the first pad 74 and first and second Kelvin connections 70 and 72.

Referring back to FIG. 2, the analog switch circuit 30 with high bipolar blocking voltage according to one embodiment includes a bipolar NPNPN SCR device 32. The bipolar NPNPN SCR device 32 includes a PNP bidirectional bipolar transistor 42 connected between the first NPN bipolar transistor 40 and the second NPN bipolar transistor 44. The first pad 74 is electrically connected to the NPNPN SCR device 32 through a first resistor 50 and an emitter of the first NPN bipolar transistor 40. The first NPN bipolar transistor 40 includes the emitter electrically connected to the first pad 74 and a collector electrically connected to a base of the PNP bidirectional bipolar transistor 42. The first NPN bipolar transistor 40 further includes a base electrically connected to a collector/emitter (C/E) of the PNP bidirectional bipolar transistor 42 and to the first resistor 50. In addition, the second pad 76 is electrically connected to the NPNPN device 32 through a second resistor 52 and an emitter of the second NPN bipolar transistor 44. The second NPN bipolar transistor 44 includes an emitter electrically connected to the second pad 76 and a collector electrically connected to the base of the PNP bidirectional bipolar transistor 42. The second NPN bipolar transistor 44 further includes a base electrically connected to an emitter/collector (E/C) of the PNP bidirectional bipolar transistor 42 and to the second resistor 52.

The collector/emitter (C/E) of the PNP bidirectional bipolar transistor 42 is electrically connected to the base of the first NPN bipolar transistor 40, and the emitter/collector (E/C) of the PNP bidirectional bipolar transistor 42 is electrically connected to the base of the second NPN bipolar transistor 44. The base of the PNP bi-directional bipolar transistor 42 is connected to the collector of the first PNP bipolar transistor 40 and further connected to the collector of the second NPN bipolar transistor 44.

The analog switch circuit 30 with high bipolar blocking voltage additionally includes a first PNP bipolar transistor 46, which can be a parasitic PNP bipolar device. The first PNP bipolar transistor 46 includes a collector connected to the first Kelvin connection 70 through a fifth resistor 58, and includes an emitter connected to the base of the first NPN bipolar transistor 40 through a third resistor 54 and the first resistor 50. The first PNP bipolar transistor 46 additionally includes a base connected to the collector of the first NPN bipolar transistor 40.

The analog switch circuit 30 with high bipolar blocking voltage additionally includes a second PNP bipolar transistor 48, which can be a parasitic PNP bipolar device. The second PNP bipolar transistor 48 includes a collector connected to the second Kelvin connection 72 through a sixth resistor 60, and includes an emitter connected to the base of the second NPN bipolar transistor 44 through a fourth resistor 56 and the second resistor 52. The second PNP bipolar transistor 48 additionally includes a base connected to the collector of the second NPN bipolar transistor 44. The analog switch circuit 30 with high bipolar blocking voltage additionally includes a second PNP bipolar transistor 48, which can be a parasitic PNP bipolar device.

The basic operation of the analog switch circuit 30 with high bipolar blocking voltage is described herein according to one embodiment. Triggering the bipolar NPNPN SCR device 32 to induce a high current path in response to a triggering voltage across the first and second pads 74 and 76 is discussed first, followed by a discussion of generation of positive feedback loops, which can maintain the high current path even when the voltage across the first and second pads 74 and 76 falls below the triggering values.

When a transient electrical event induces a voltage difference between the first and second pads 74 and 76 greater than a certain threshold voltage, the bipolar NPNPN SCR device 32 can be triggered. The NPNPN device 32 can be triggered in either voltage polarities because the combination of the PNP bidirectional bipolar transistor 42 and the first NPN bipolar transistor 40 can operate as a first cross-coupled PNPN SCR configured to be triggered by a first voltage polarity, and the combination of the PNP bidirectional bipolar transistor 42 and the second NPN bipolar transistor 44 can operate as a second cross-coupled PNPN SCR configured to be triggered by a second voltage polarity.

In this embodiment, the first cross-coupled PNPN SCR comprises a first P-region comprising the collector/emitter (C/E) of the PNP bidirectional bipolar transistor 42, and a first N-region comprising the base of the PNP bidirectional bipolar transistor 42 connected to the collector of the first NPN bipolar transistor 40. The first cross-coupled PNPN SCR further comprises a second P-region comprising the emitter/collector (E/C) of the PNP bidirectional bipolar transistor 42 connected to the base of the first NPN bipolar transistor 40, and a second N-region comprising the emitter of the first NPN bipolar transistor 40. In one aspect, the second P-region, the first P-region, and the second N-region correspond to a "gate," an "anode," and a "cathode," respectively, of the first PNPN SCR. The first PNPN SCR can be turned on or "triggered" when a positive voltage signal is applied to the gate relative to the cathode of the first PNPN SCR. This can occur, for example, when a transient electrical event induces a negative voltage on the first pad 74 relative to the second pad 76 (or alternatively, a positive voltage on the second pad 76 relative to the first pad 74) that exceeds a negative trigger voltage $-V_{TR}$ in absolute value. When this occurs, the first NPN bipolar transistor 40 starts to conduct. When the first NPN bipolar transistor 40 starts to conduct, its collector potential is pulled down, which in turn pulls down the base potential of the PNP bidirectional bipolar transistor 42. This in turn causes the PNP bidirectional bipolar transistor 42 to conduct. When the PNP bidirectional bipolar transistor 42 starts to conduct, its collector potential is pulled up, which in turn pulls up the base potential of the second NPN bipolar transistor 44. In this way, there can be a positive feedback that reinforces the conducting states of the second NPN bipolar transistor 44 and the PNP bidirectional bipolar transistor 42.

Similarly, the second cross-coupled PNPN SCR comprises a first P-region comprising the emitter/collector (E/C) of the PNP bidirectional bipolar transistor 42, and a first N-region comprising the base of the PNP bidirectional bipolar transistor 42 connected to the collector of the second NPN bipolar transistor 44. The second cross-coupled PNPN SCR further comprises a second P-region comprising the collector/emitter (C/E) of the PNP bidirectional bipolar transistor 42 connected to the base of the second NPN bipolar transistor 44, and a second N-region comprising the emitter of the second NPN bipolar transistor 44. The second PNPN SCR can be turned on or "triggered" when a positive voltage signal is applied to the gate relative to the cathode of the second PNPN SCR in substantially similar manner as described above in connection with the first PNPN SCR. This can occur, for example, when a transient electrical event induces a positive voltage on the first pad 74 relative to the second pad 76 (or alternatively, a negative voltage on the second pad 76 relative to the first pad 74) that exceeds a positive trigger voltage $+V_{TR}$ in absolute value.

As discussed above, once the absolute value of the voltage difference between first and second pads 74 and 76 exceeds the positive or negative trigger voltages $+/-V_{TR}$, the NPNPN device 32 enters into a low impedance mode. Once the low impedance mode is triggered, it can be maintained by a feedback loop formed between one of the first and second NPN bipolar transistors 40 and 44 and the PNP bi-directional bipolar transistor 42, even if the absolute voltage across the first and second pads 74 and 76 subsequently falls below positive or negative trigger voltages $+/-V_{TR}$.

A feedback loop within the first or second PNPN SCRs can operate as follows, according to one embodiment. An increase in the collector current of the first or second NPN bipolar transistors 40 or 44 increases the base current of the PNP bi-directional bipolar transistor 42 and an increase in the collector current of the PNP bi-directional bipolar transistor 42 increases base currents of the first or second NPN bipolar transistors 40 or 44. Because the collector current of the PNP bi-directional bipolar transistor 42 and one of the first or second NPN bipolar transistors 40 and 44 feeds into the base current of the PNP bi-directional bipolar transistor 42 and vice versa, a feedback loop is generated. The feedback loop can be regenerative because of the gains of the individual bipolar transistors and cause the NPNPN device 32 to enter a low-impedance state. Once in the low impedance state, the NPNPN device 32 can remain in the low impedance state until the absolute value of the voltage across the first and second pads 74 and 76 falls below a holding voltage $+/-V_H$, or the current falls below $+/-I_H$, or both, in response to positive and negative triggering events by positive and negative trigger voltages $+/-V_{TR}$.

Figure 3:
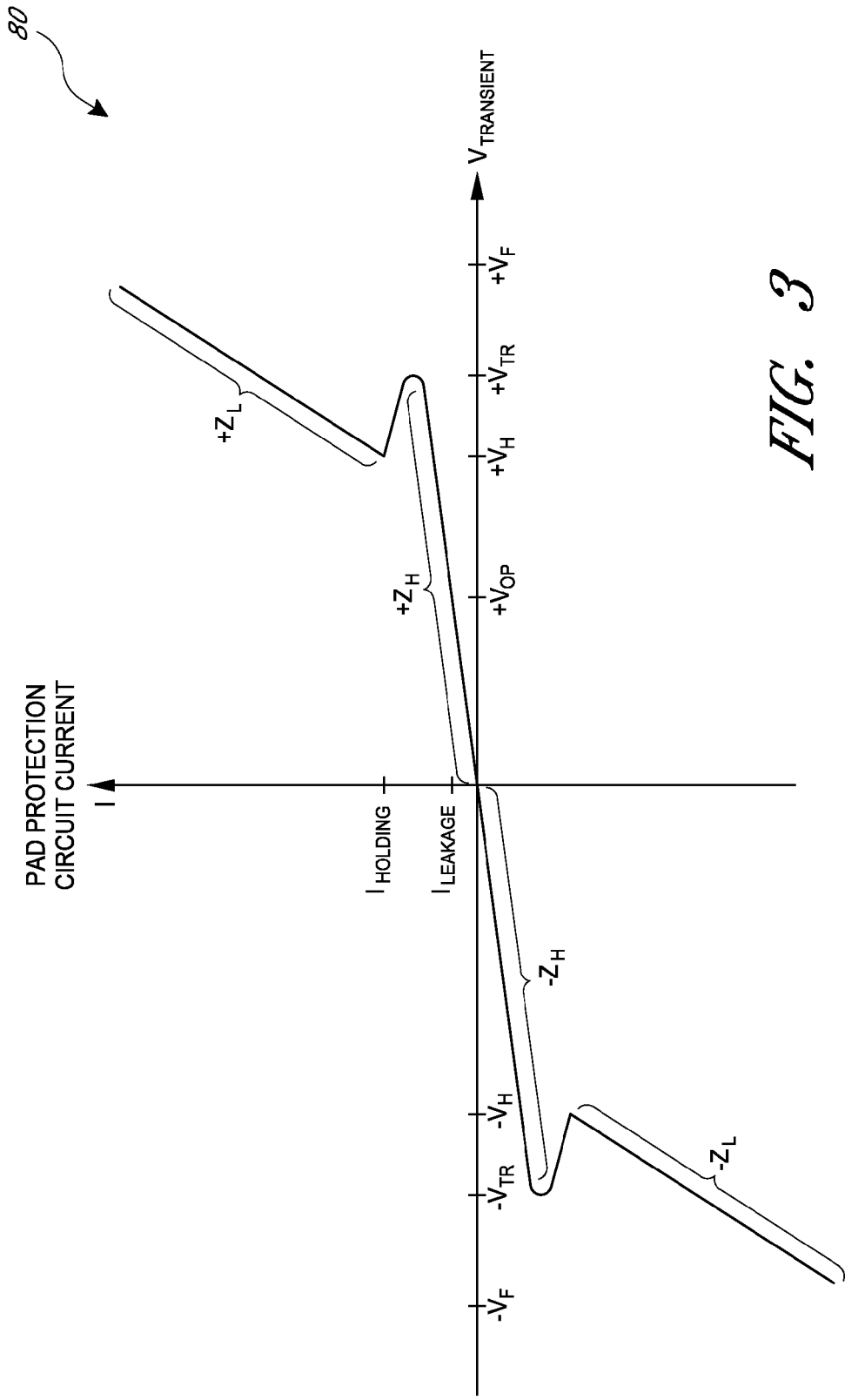
FIG. 3 is a schematic graph showing a current-voltage relationship of an analog switch with high bipolar blocking voltage according to one embodiment.

FIG. 3 is a schematic I-V curve 80 showing a relationship between current and voltage of an analog switch circuit with high bipolar blocking voltage according to one embodiment. In FIG. 3, voltage is expressed along a horizontal axis, and current is expressed along a vertical axis. In the illustrated embodiment, the protection device has I-V characteristics that are symmetrical. In other implementations, the protection devices described herein can have asymmetrical I-V characteristics. For example, protection devices can have different trigger voltages, holding voltages, and/or failure voltages with different I-V curves in the positive and negative regions of the schematic I-V curve 80. As shown in the schematic I-V curve 80, the analog switch circuit with high bipolar blocking voltage can transition from a high-impedance state $+Z_H$ to a low-impedance state $+Z_L$ when the voltage of the transient signal $V_{TRANSIENT}$ reaches a positive trigger voltage $+V_{TR}$. Thereafter, the analog switch circuit with high bipolar blocking voltage can shunt a large amount of current and remain in the low-impedance state $+Z_L$ as long as the transient signal voltage level remains above a positive holding voltage $+V_H$. By configuring the protection device to have a trigger voltage $+V_{TR}$ and a holding voltage $+V_H$, the protection device can have improved performance while having enhanced stability against unintended activation.

The analog switch circuit with high bipolar blocking voltage can also transition from a high-impedance state $-Z_H$ to a low-impedance state $-Z_L$ when the voltage of the transient signal $V_{TRANSIENT}$ reaches a negative trigger voltage $-V_{TR}$. The analog switch circuit with high bipolar blocking voltage can remain in the low-impedance state $-Z_L$ as long as the voltage magnitude of the negative transient signal is greater than the voltage magnitude of the negative holding voltage $-V_H$. Bi-directional operation of the protection device can permit a reduction in layout area relative to a design that uses separate structures for protection against positive and negative transient electrical events, thereby enabling a more scalable design solution for low voltage operation.

As shown in FIG. 3, the analog switch circuit with high bipolar blocking voltage can be configured to transition to a low-impedance state before the voltage of the transient signal $V_{TRANSIENT}$ reaches either a positive failure voltage $+V_F$ or a negative failure voltage $-V_F$ that can otherwise cause damage to the IC. When a normal operating voltage $+V_{OP}$ is present across the analog switch circuit with high bipolar blocking voltage, the analog switch circuit with high bipolar blocking voltage should conduct a relatively small leakage current $I_{LEAKAGE}$, thereby reducing or minimizing static power dissipation and enhancing the energy efficiency of the IC.

In certain implementations described herein, protection devices are configured to provide forward and reverse trigger voltages having magnitudes in the range of about 10 V to about 25 V and forward and reverse holding voltages having magnitudes in the range of about 5 V to about 10 V so as to limit the magnitude of the voltage across core devices to be less than about 20 V. Other applicable trigger and holding voltages will be readily determined by one of ordinary skill in the art.

Various parameters illustrated in FIG. 3 can be tailored to have values suitable for particular applications of the analog switch circuit with high bipolar blocking voltage. One parameter that can be tailored is the trigger voltage $V_{TR}$ of the NPNPN SCR device. On the other hand, another consideration in designing the analog switch circuit with high bipolar blocking voltage is to ensure that parasitic devices do not have turn-on voltages lower than the trigger voltage $V_{TR}$. For example, referring back to FIG. 2, first and second PNP bipolar transistors 46 and 48 can form first and second parasitic PNPN SCRs in combination with first and second NPN bipolar transistors 40 and 44, as described below.

The analog switch circuit 30 with high bipolar blocking voltage of FIG. 2 according to one embodiment can include a first parasitic PNPN SCR that provides an alternative current path in response to a transient electrical event. In the illustrated embodiment of FIG. 2, the first parasitic PNPN SCR includes a first PNP bipolar transistor 46 and the first NPN bipolar transistor 40 arranged in a silicon-controlled rectifier (SCR) configuration similar to the first and second PNPN SCRs described above. In particular, the emitter of the first PNP bipolar transistor 46 is connected to the base of the first NPN bipolar transistor 40 (via the third resistor 43 and the first resistor 50), and the collector of the first NPN bipolar transistor 40 is connected to the base of the first PNP bipolar transistor 46. Similar to the first and second PNPN SCRs described above, the first parasitic PNPN SCR can be triggered to enter into a regenerative feedback loop when the voltage difference between first pad 74 and the first Kelvin connection 70 exceeds a certain value. For example, when a positive voltage difference between the first Kelvin connection 70 and the first pad 74 exceeds a trigger voltage $+V_{TR\ PARA}$ of the first parasitic PNPN SCR, the first parasitic PNPN SCR can enter into a low impedance mode similar to that which occurs in the bipolar NPNPN device 32 due to a feedback loop. Once in the low impedance state, the first parasitic PNPN SCR can remain in the low impedance state until the positive voltage difference between the first Kelvin connection 70 and the first pad 74 falls below $+V_H$, or the current falls below $+I_H$, or both.

The analog switch circuit 30 with high bipolar blocking voltage according to one embodiment can further include the second parasitic PNPN SCR that provides another alternative current path in response to a transient electrical event. In the illustrated embodiment of FIG. 2, the second parasitic PNPN SCR includes a second PNP bipolar transistor 44 and the second NPN bipolar transistor 44 arranged in a silicon-controlled rectifier (SCR) configuration similar to the first parasitic PNPN SCR described above. In particular, the emitter of the second PNP bipolar transistor 48 is connected to the base of the second NPN bipolar transistor 44 (via the fourth resistor 56 and the second resistor 52), and the collector of the second NPN bipolar transistor 44 is connected to the base of the second PNP bipolar transistor 56. The second parasitic PNPN SCR can be triggered and can remain in the low impedance state in substantially similar manner as described above for first parasitic PNPN SCR, in response to a positive voltage difference between the second Kelvin connection 72 and the second pad 76 that exceeds a certain value. For example, when a positive voltage difference between the second Kelvin connection 72 and the second pad 76 exceeds a trigger voltage $+V_{TR\ PARA}$ of the second parasitic PNPN SCR, the second parasitic PNPN SCR can enter into a low impedance mode similar to that which occurs in the bipolar NPNPN device 32 due to a feedback loop. Additionally, as in the first parasitic PNPN SCR, once in the low impedance state, the second parasitic PNPN SCR can remain in the low impedance state until the positive voltage difference between the second Kelvin connection 72 and the second pad 76 falls below $+V_{H\ PARA}$, or the current falls below $+I_{H\ PARA}$, or both.

As described, because the parasitic PNPN SCRs may be triggered in a similar fashion as the core bipolar NPNPN SCR device, it may be useful to configure the analog switch circuit with high bipolar blocking voltage such that the core NPNPN SCR devices have trigger voltages that are lower than the trigger voltage values of the parasitic PNPN SCRs. In general, there are many factors that can control the trigger voltages of PNPN SCRs that in turn control the trigger voltages of NPNPN SCR devices. In general, the ratio of carrier lifetimes, the ratio of doping, and the ratio of diffusion lengths between an emitter and a base determine the gain of a bipolar transistor. A higher gain of the individual bipolar transistors within the PNPN SCRs in turn generally results in a lower trigger voltage. For example, a higher minority carrier lifetime in the base, a lower doping concentration in the base, and smaller physical base width may result in a higher gain of the a PNP bipolar transistor such as the PNP bi-directional bipolar transistor 42 in FIG. 2. A higher gain of the PNP bi-directional bipolar transistor 42 in turn can result in lower trigger voltages of the first and second PNPN SCRs of the bipolar NPNPN device 32. Similarly, a higher gain of the first and second NPN bipolar transistors 40 and 44 can also result in lower trigger voltages of the first and second PNPN SCRs of the bipolar NPNPN device 32 device, respectively.

As an example, $V_{TR}$ of an analog switch circuit with high bipolar blocking voltage for a mixed-signal process such as 3.3 V and 5 V mixed-signal process for 0.18-µm node can be limited by parasitic breakdown resulting from breakdowns of typical junctions, such as N+ active region to P-well (PW) junction, P+ active region to N-well (NW) junction, NW to PW junction, and NW to substrate. These junctions practically limit the $V_{TR}$ between about 8.5 V to 14.5 V. As described above, however, many emerging applications require higher $V_{TR}$. In the following, embodiments directed to tailoring various parameters of the analog switch circuit with high bipolar blocking voltage including $V_{TR}$ are disclosed. In particular, embodiments relate to core analog switch circuits with high bipolar blocking voltage having trigger voltage $V_{TR}$ values exceeding typical breakdown voltages, while having sufficient trigger voltage $V_{TR\_PARA}$ such that parasitic devices can be prevented from triggering.

Figure 4A:
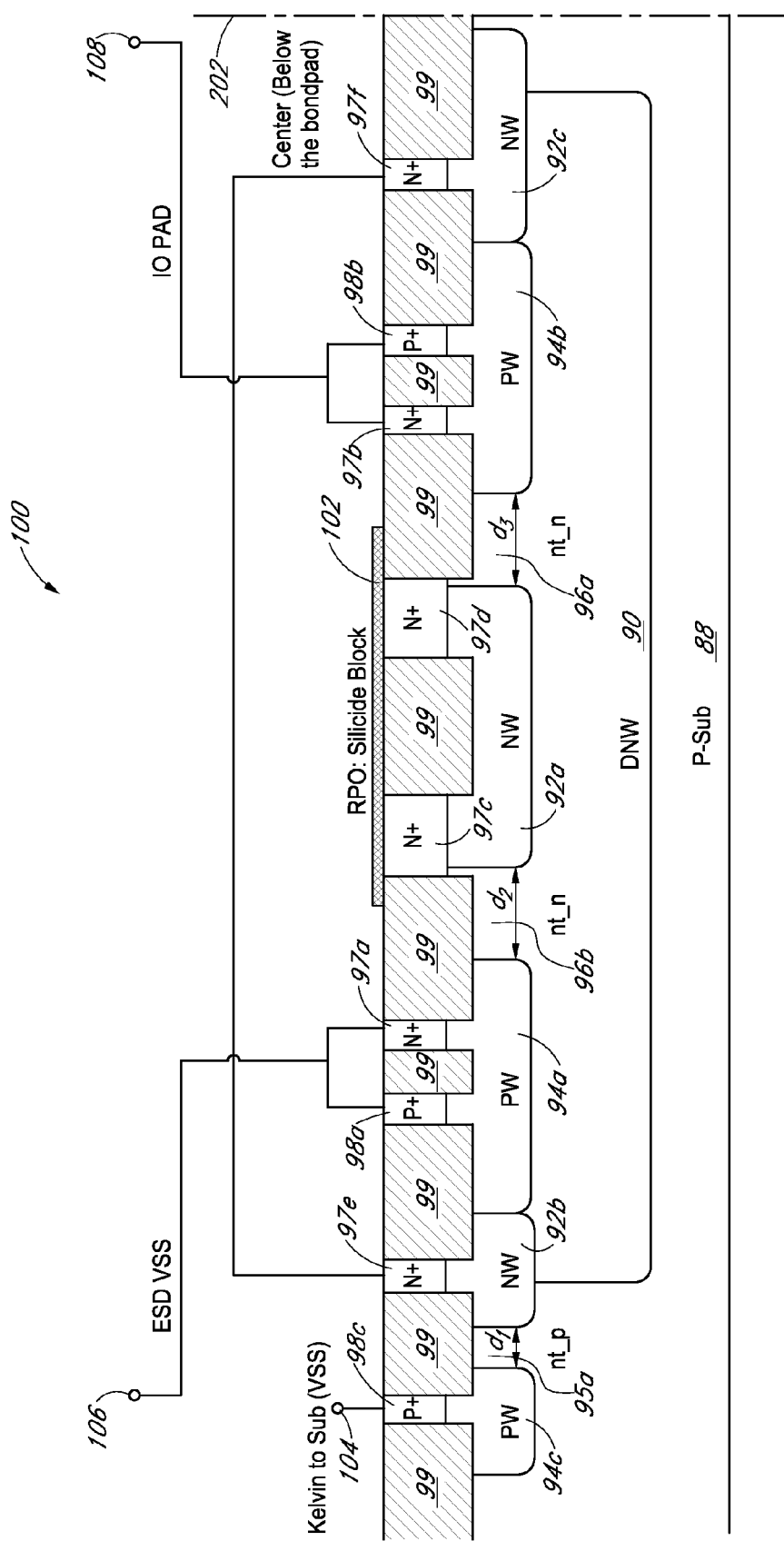
FIG. 4A is a cross-sectional view of an analog switch with high bipolar blocking voltage according to one embodiment.
Figure 4B:
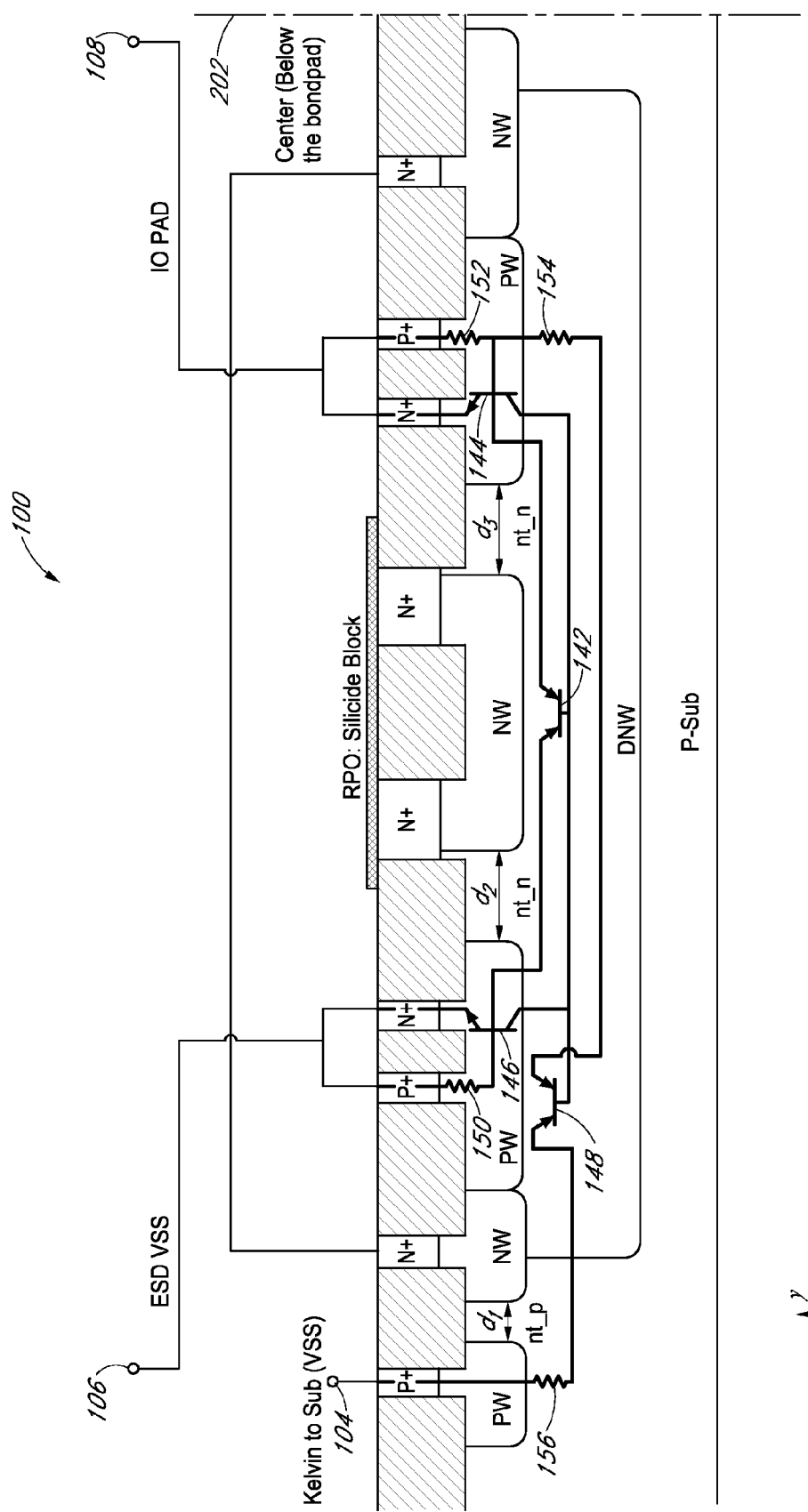
FIG. 4B is a cross-sectional view of an analog switch with high bipolar blocking voltage annotated with circuit elements according to one embodiment.

FIGS. 4A and 4B illustrate cross-sectional views of an analog switch 100 with high bipolar blocking voltage according to one embodiment. FIG. 4A illustrates various well regions of the analog switch 100 with high bipolar blocking voltage, while FIG. 4B illustrates a circuit representation of the various well. One embodiment of the analog switch 100 with high bipolar blocking voltage is mirror-symmetric about a plane of symmetry 202 formed by the y direction and the z direction at the center of the analog switch 100 with high bipolar blocking voltage (at the far right of FIGS. 4A and 4B). Thus, due to the symmetry of the illustrated embodiment, features discussed below with respect to one half of the device (shown in the figures) are also be applicable to the other half of the device (not shown).

The analog switch 100 with high bipolar blocking voltage of FIGS. 4A and 4B includes a protection discharge path between first and second terminals 106 and 108. The first terminal 106 can be an ESD VSS connection and the second terminal can be an I/O pad connection. For example, the first terminal 106 can be connected to the transceiver circuit substrate at $V_{ss}$ through a high current power rail. The high current power rail typically has a relatively low resistance and be designed to handle a relatively large amount of current in response to a transient electrical event. The analog switch 100 with high bipolar blocking voltage can be further be connected to the substrate of the transceiver circuit at $V_{ss}$ or ground through a first Kelvin connection 104, which can be relatively high resistance paths, passing a relatively low amount of current flowing in response to the same transient electrical event that can trigger a relatively large amount of current to pass through the high current power rail. The second terminal 108 can also be connected to an I/O pad through a high current power rail.

Referring to FIG. 4A, the illustrated analog switch 100 with high bipolar blocking voltage includes a p-type substrate (P-SUB) 88 and a deep n-well region (DNW) 90 formed within the P-SUB 88. The analog switch 100 with high bipolar blocking voltage comprises a first p-type well region (PW) 94a, a second p-type well region (PW) 94b, and a first n-type well region (NW) 92a disposed between the first and second p-type well regions. The first p-type well region (PW) 94a, the second p-type well region PW 94b, and the first n-type well region (NW) 92a are formed in the DNW 90. The first NW 92a is disposed between the first and second PWs 94a and 94b. Disposed in the first NW 92a are third and fourth n-type active (N+) regions 97c and 97d separated by an isolation 99. Disposed over the third and fourth N+ regions 97c and 97d is a resist protective oxide (RPO) layer 102 for preventing salicidation of the third and fourth N+ regions 97c and 97d.

The analog switch 100 with high bipolar blocking voltage additionally includes a first native n-type region (nt_n) 96b disposed between the first PW 94a and the first NW 92a, a second native n-type region (nt_n) 96a disposed between the second PW 94b and the first NW 92a. The first and second nt_n regions 96b and 96a are formed by hard-masking when performing ion implantation to form the NW and PW regions, such that the nt_n regions do not receive the well implants. In this way, the first and second nt_n regions have "native doping" levels similar to doping levels of the nt_n regions that existed prior to formation of the first and second PW 94a and 94b and the first NW 92a. In the illustrated embodiment, the "native doping" level can corresponds to the doping level of the nt_n regions after forming the DNW 90. By forming the extra isolated native region, it allows the definition of a low doping concentration buffer region without extra fabrication processing steps in CMOS technology processes.

Referring to FIGS. 4A and 4B, the first NW 92a, the first nt_n 96b, and the second nt_n 96a are configured to form a base of the bidirectional PNP bipolar transistor 142 having an N-/N/N-structure. In addition, the second PW is configured to form a collector/emitter of the bidirectional PNP bipolar transistor. Additionally, the first PW 94a is configured to form an emitter/collector (E/C) of the bidirectional PNP bipolar transistor 142 and the second PW 94b is configured to form a collector/emitter (C/E) of the bidirectional PNP bipolar transistor 142. The DNW 90 surrounds the bidirectional PNP bipolar transistor 142.

Referring to FIG. 4A, analog switch 100 with high bipolar blocking voltage further comprises a first n-type active (N+) region 97a disposed in the first PW 94a and a second n-type active (N+) region 97b disposed in the second PW 94b. The first and third N+ regions 97a and 97c are separated by an isolation 99 and the second and fourth N+ regions 97b and 97d are separated by an isolation 99. Referring to FIGS. 4A and 4B, the first N+ region 97a, the first PW 94a, and the DNW 90 are configured to form an emitter, a base, and a collector of a first NPN bipolar transistor 146. The first terminal 106 is connected to the base of the first NPN bipolar transistor 146 through a first P+ region 98a and a first resistor 150 and further connected to the emitter of the first NPN bipolar transistor 146 through a first N+ region 97a. In addition, the second N+ region 97b, the second PW 94b, and the DNW 90 are configured to form an emitter, a base, and a collector of a second NPN bipolar transistor 144. The second terminal 108 is connected to the base of the second NPN bipolar transistor 144 through a second P+ region 98b and a second resistor 152 and further connected to the collector of the second NPN bipolar transistor 144 through a second N+ region 97b According to one embodiment, the first NPN bipolar transistor 146, the bidirectional PNP bipolar transistor 142, and the second NPN bipolar transistor 144 form an NPNPN bidirectional silicon-controlled rectifier (SCR). The E/C of the bidirectional PNP bipolar transistor 142 is electrically connected to the base of the first NPN bipolar transistor 146, the C/E of the bidirectional PNP bipolar transistor 142 is electrically connected to the base of the second NPN bipolar transistor 144, and the base of the bidirectional PNP bipolar transistor 142 is electrically connected to collectors of the first and second NPN bipolar transistors 146 and 144. The configuration provides a bidirectional high current shunt path responsive to an external transient electrical event which induces a voltage difference between the first and second terminals 106 and 108 that exceeds a certain critical value. Basic operation of the NPNPN bidirectional silicon rectifier is similar to the bipolar NPNPN device of FIG. 2.

In particular, when a transient electrical event induces a voltage difference between the first and second terminals 106 and 108 greater than a certain threshold voltage, the NPNPN bidirectional SCR operates as a cross-coupled PNPN silicon-controlled rectifier (PNPN SCR) device according to one embodiment of the present invention. That is, the combination of the PNP bidirectional bipolar transistor 142 and the first NPN bipolar transistor 146 can operate as a first cross-coupled PNPN SCR. The first PNPN SCR comprises the emitter/collector E/C, the base, and the collector/emitter C/E of the PNP bidirectional bipolar transistor 142 connected to the base of the first NPN bipolar transistor 146. Similarly, the combination of the PNP bidirectional bipolar transistor 142 and the second NPN bipolar transistor 144 can operate as a second cross-coupled PNPN SCR.

The first and second cross-coupled PNPN SCRs can be turned on or "triggered" when a positive voltage signal is applied to the gate relative to the cathode of the second PNPN SCR in substantially similar manner as described above in connection with the PNPN SCRs in FIG. 2. The first PNPN SCR can be triggered, for example, when a transient electrical event induces a positive voltage on the first terminal 106 relative to the second terminal 108 (or alternatively, a negative voltage on the second terminal 108 relative to the first terminal 106) that exceeds the trigger voltage $V_{TR}$. Similarly, the second PNPN SCR can be triggered, for example, when a transient electrical event induces a positive voltage on the second terminal 108 relative to the first terminal 106 (or alternatively, a negative voltage on the first terminal 106 relative to the second terminal 108) that exceeds the trigger voltage $V_{TR}$.

Still referring to FIGS. 4A and 4B, the analog switch 100 with high bipolar blocking voltage further comprises a first p-type active (P+) region 98a disposed in the first PW 94a and electrically connected to the base of the first NPN bipolar transistor 146 through a first resistor 150, and a second p-type active (P+) region 98b disposed in the second PW 94b and electrically connected to the base of second NPN bipolar transistor 144 through a second resistor 152. The first and second P+ regions 98a and 98b are separated from first and second N+ regions 97a and 97b, respectively, by isolations 99. The first resistor 150 is formed in the first PW 94a and the second resistor 152 is formed in the second PW 94b. The second PW 94b has a first side and a second side, where the first side of the second PW 94b is adjacent the second native n-type region 96a, and the analog switch 100 with high bipolar blocking voltage further comprises a second n-type well region (NW) 92c disposed on the second side of the second PW 94b. The first PW 94a has a first side and a second side, where the second side of the first PW 94a is adjacent the first native n-type region 96b, and the analog switch 100 with high bipolar blocking voltage further comprises a third n-type well region (NW) 92b disposed on the first side of the second PW 94b. In the illustrated embodiment, a fifth n-type active (N+) region 97f is formed in the second NW 92c and a sixth n-type active (N+) region 97e is formed in the third NW 92b. The third NW 92b has a first side and a second side, where the second side of the third NW 92b region is adjacent the first PW 94a, and the analog switch 100 with high bipolar blocking voltage further comprises a third p-type well region (PW) 94c disposed on the first side of the third NW 92b and a third p-type active (P+) region 98c disposed in the third PW 94c. Furthermore, the analog switch 100 with high bipolar blocking voltage includes a native p-type region 95a interposed between the third NW 92b and the third PW 94c. In the configuration of the analog switch 100 with high bipolar blocking voltage in FIG. 4A, the DNW 90 extends in the x-direction such that a first side of the DNW 90 is disposed between first and second sides of the third NW 92b and a second side of the DNW 90 is disposed between first and second sides of the second NW 92c. That is, the second NW 92c and the third NW 92b are only partially formed in DNW 90.

The analog switch 100 with high bipolar blocking voltage has first and second terminals 106 and 108 configured to receive a transient voltage signal. The first terminal 106 is connected to the first N+ region 97a and to the first P+ region 98a. The second terminal 108 is connected to the second N+ region 97b and to the second P+ region 98b. As discussed above, the analog switch 100 with high bipolar blocking voltage is configured to provide a high current shut path through the first NPN bipolar transistor 146, the bidirectional PNP bipolar transistor 142, and the second NPN bipolar transistor 144, which are configured to form a NPNPN bidirectional silicon-controlled rectifier (SCR). The NPNPN bidirectional SCR can be triggered in either voltage polarity because the combination of the PNP bidirectional bipolar transistor 142 and the first NPN bipolar transistor 146 can operate as a first cross-coupled PNPN SCR configured to be triggered by a first voltage polarity and the combination of the PNP bidirectional bipolar transistor 142 and the second NPN bipolar transistor 144 can operate as a second cross-coupled PNPN SCR configured to be triggered by a second voltage polarity.

Referring to FIG. 4B, in addition to the core NPNPN bidirectional SCR device, the analog switch 100 with high bipolar blocking voltage can include a parasitic PNP bipolar transistor 148. When the parasitic PNP bipolar transistor 148 is present, the third P+ region 98c, the third PW 94c, and the P-SUB 88 are configured to form an emitter of the parasitic PNP bipolar transistor 148. The emitter of the parasitic PNP bipolar transistor 148 is configured to be connected to the Kelvin connection 104 at Vss through a fourth resistor 156 formed in the P-SUB 88 and the fourth PW 94d. In addition, the deep n-type well 90 and the second PW 94b are configured to form a base and a collector of the parasitic PNP bipolar transistor.

As discussed above, the core NPNPN bidirectional SCR device of the analog switch 100 with high bipolar blocking voltage can be triggered, as an example, when a transient electrical event induces a positive voltage on the second terminal 108 relative to the first terminal 106. In addition, a parasitic PNPN SCR can provide an alternative current path in response to the transient electrical event. In the illustrated embodiment of FIG. 4B, the parasitic PNPN SCR includes the parasitic PNP bipolar transistor 148 and the second NPN bipolar transistor 144 arranged in a silicon-controlled rectifier (SCR) configuration. In particular, the collector of the parasitic PNP bipolar transistor 148 is connected to the base of the second NPN bipolar transistor 144 through a third resistor 154. In addition, the collector of the second NPN bipolar transistor 144 is connected to the base of the parasitic PNP bipolar transistor 148. Similar to the first and second PNPN SCRs described above, the first parasitic PNPN SCR can be triggered to enter into a regenerative feedback loop, for example, when the voltage difference between the second terminal 108 and the first Kelvin connection 104 at Vss exceeds a trigger voltage $+V_{TR\_PARA}$ of the parasitic PNPN SCR, which can cause the parasitic PNPN SCR to enter into a low impedance mode similar to that which occurs in the bipolar NPNPN. An increase in the collector current of the parasitic PNP bipolar transistor 148 increases the base current of the second NPN bipolar transistor 144 and an increase in the collector current of the second NPN bipolar transistor 144 increases the base current of the parasitic PNP bipolar transistor 148. Once in the low impedance state, the parasitic PNPN SCR can remain in the low impedance state until the positive voltage difference between the second terminal 108 and the Kelvin connection 104 falls below $+V_{H\_PARA}$, or the current falls below $+I_{H\_PARA}$, or both.

In some embodiments, customizing the trigger voltages $+/-V_{TR}$ of the core NPNPN SCR device while having sufficient margin against +/−$V_{TR\_PARA}$ of parasitic PNPN SCRs, can be achieved through targeting lateral widths or the doping concentration of the native n-type and native p-type regions or both. Referring to FIGS. 4A and 4B, the native p-type region 95a, the first native n-type regions 96b, and the second native n-type region 96a have first, second, and third widths $d_1$, $d_2$, and $d_3$. In one embodiment, each of the first to third widths $d_1$-$d_3$ can be less than about 5 μm. In another embodiment, each of the first to third widths $d_1$-$d_3$ can be between about 0.5 μm and about 2 μm, for instance about 1 μm.

In addition, the native p-type region 95a, the first native n-type regions 96b, and the second native n-type region 96a of FIGS. 4A and 4B have first, second, and third native doping concentrations. In one embodiment, each of the first doping concentrations can be between about $1 \times 10^{13}$ cm$^{-3}$ and about $1 \times 10^{15}$ cm$^{-3}$, for instance about $5 \times 10^{14}$ cm$^{-3}$. In another embodiment, each of the first, second, and third native doping concentrations can be between about $1 \times 10^{14}$ cm$^{-3}$ and about $1 \times 10^{15}$ cm$^{-3}$, for instance about $6 \times 10^{14}$ cm$^{-3}$.

In addition, various P+ regions and N+ region have a peak doping concentration in the range of about $1 \times 10^{20}$ cm$^{-3}$ to about $8 \times 10^{20}$ cm$^{-3}$, for example, about $2 \times 10^{20}$ cm$^{-3}$. In addition, various PWs and NWs have a peak doping concentration in the range of about $1.5 \times 10^{16}$ cm$^{-3}$ to about $7.5 \times 10^{16}$ cm$^{-3}$, for example, about $5.0 \times 10^{16}$ cm$^{-3}$. Although various ranges of peak doping concentrations and depth have been described above, persons having ordinary skill in the art will readily ascertain other suitable doping concentrations.

Figure 5A:
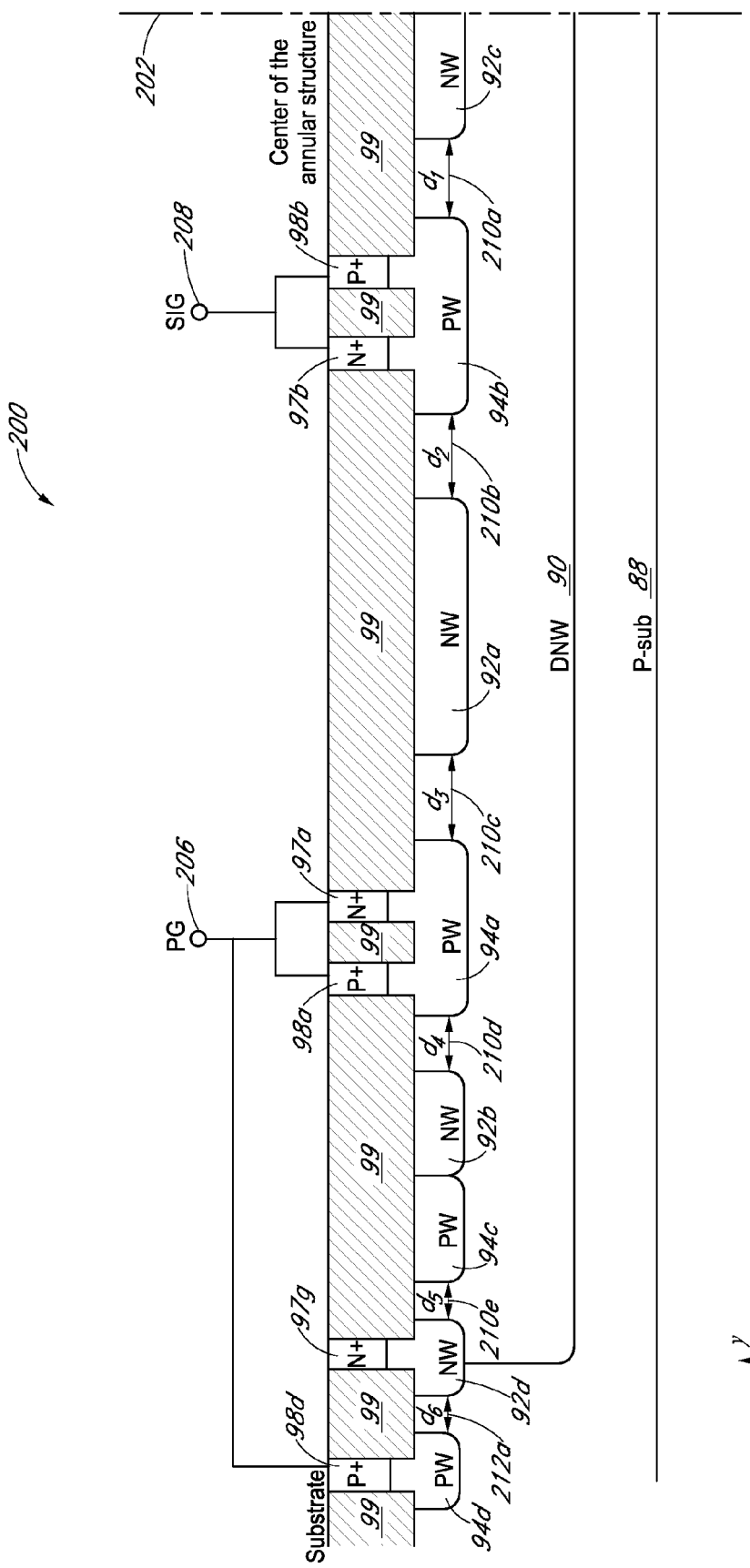
FIG. 5A is a cross-sectional view of an analog switch with high bipolar blocking voltage according to another embodiment.
Figure 5B:
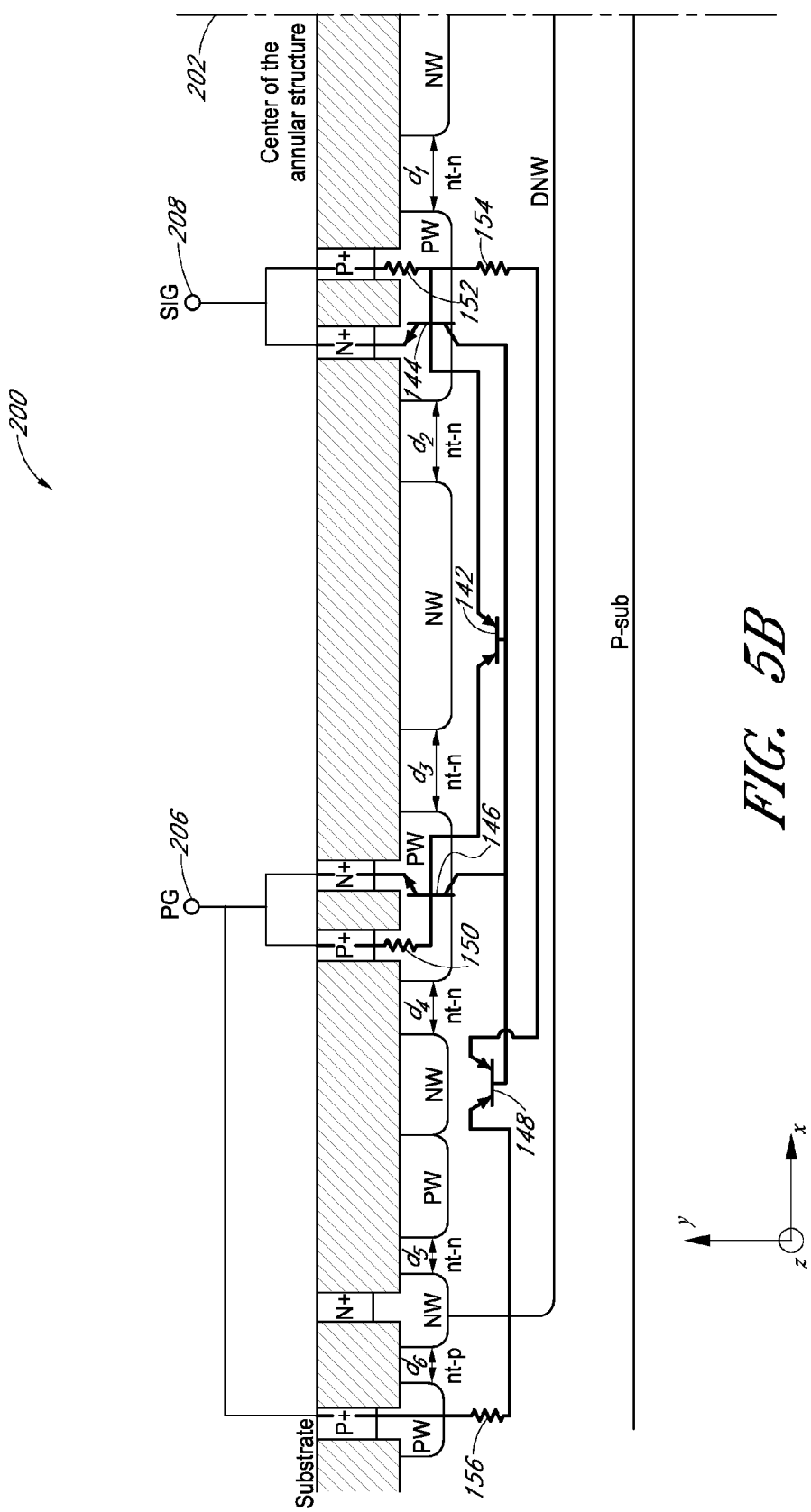
FIG. 5B is a cross-sectional view of an analog switch with high bipolar blocking voltage annotated with circuit elements according to another embodiment.
Figure 5C:
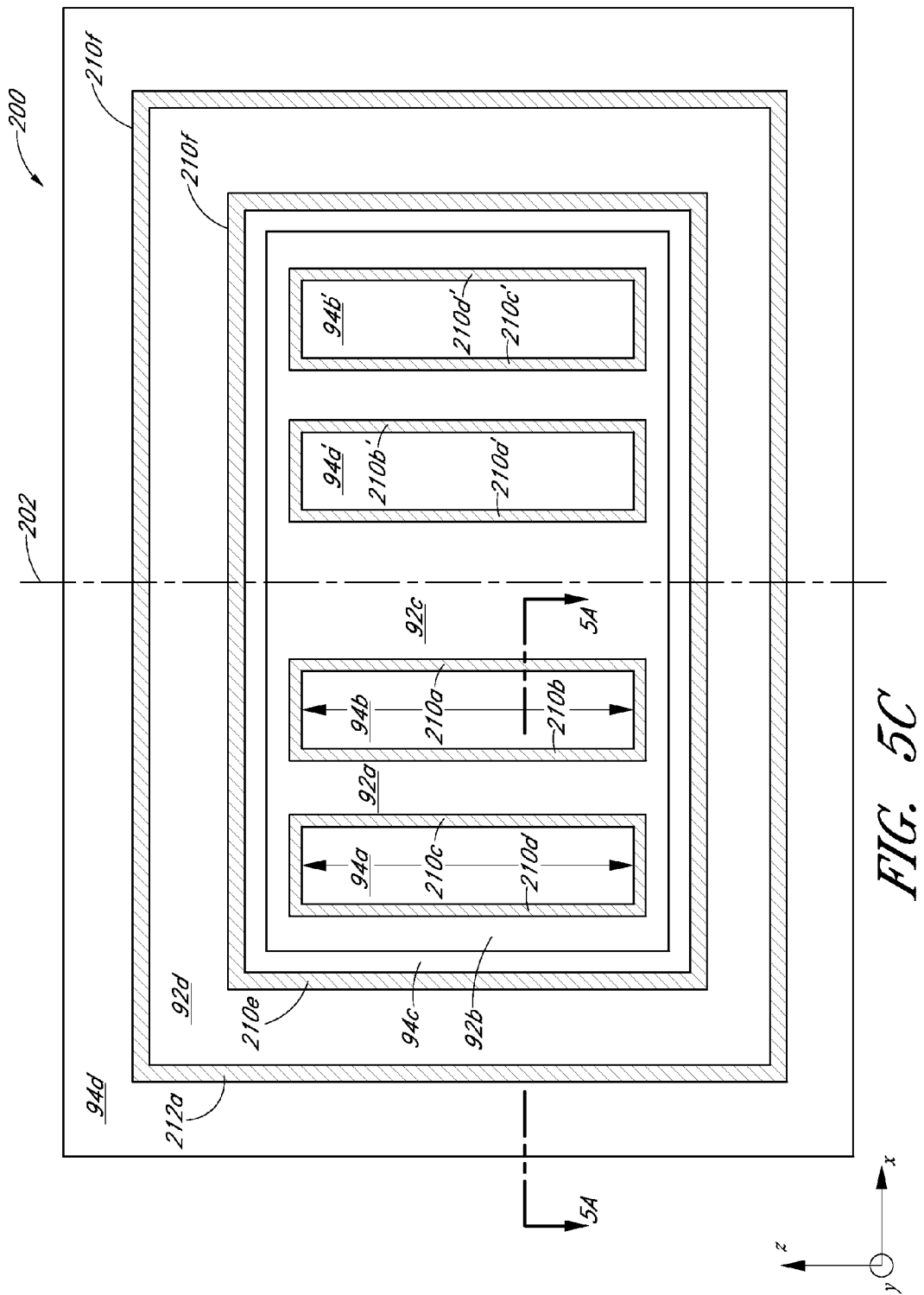
FIG. 5C is a plan-view view of an analog switch with high bipolar blocking voltage according to another embodiment.

FIGS. 5A-5C illustrate additional embodiments directed to analog switch circuit with high bipolar blocking voltage having high $V_{TR}$ values while preventing parasitic devices from triggering. FIG. 5C is a plan-view of an analog switch 200 with high bipolar blocking voltage. FIGS. 5A and 5B illustrate a cross-sectional view of the analog switch 200 with high bipolar blocking voltage along the cross-section 5A-5A illustrated in FIG. 5C.

FIG. 5A illustrates a physical representation of various well regions of the analog switch 200 with high bipolar blocking voltage, while FIG. 5B illustrates a circuit representation of the various well regions annotated with various circuit elements. When viewed in a y direction perpendicular to a surface of the analog switch 200 with high bipolar blocking voltage, the analog switch 200 with high bipolar blocking voltage is symmetric about a plane of symmetry formed by the y direction and the z direction at the center of the analog switch 200 with high bipolar blocking voltage (at the far right of FIGS. 5A and 5B). Thus, due to the symmetry of the illustrated embodiment, features discussed below with respect to one half of the device (shown in the figures) can also be applicable to the other half of the device (not shown).

The analog switch 200 with high bipolar blocking voltage of FIGS. 5A and 5B includes a protection discharge path between first (PG) and second (SIG) terminals 206 and 208. The first terminal 206 can be a high current power rail connection to the transceiver circuit substrate at $V_{ss}$ through a first n-type active (N+) region 97a and a first p-type active (P+) region 98a. The analog switch 200 with high bipolar blocking voltage can be further be connected to the substrate of the transceiver circuit at $V_{ss}$ or ground through a first Kelvin connection at a fourth p-type active (P+) region 98d. The second terminal 208 can be a high current power rail configured to receive a positive high voltage transient signal through a second n-type active (N+) region 97b and a second p-type active (P+) region 98b.

Referring to FIG. 5A, the illustrated analog switch 200 with high bipolar blocking voltage includes a p-type substrate (P-SUB) 88 and a deep n-well region (DNW) 90 formed within the P-SUB 88. The analog switch 200 with high bipolar blocking voltage comprises a first p-type well region (PW) 94a, a second p-type well region (PW) 94b, and a first n-type well region (NW) 92a disposed between the first and second p-type well regions. The first p-type well region (PW) 94a, the second p-type well region PW 94b, and the first n-type well region (NW) 92a are formed in the DNW 90. The first NW 92a is disposed between the first and second PWs 94a and 94b.

The analog switch 200 with high bipolar blocking voltage additionally includes a first native n-type region (nt_n) 210c disposed between the first PW 94a and the first NW 92a and a second native n-type region (nt_n) 210b disposed between the second PW 94b and the first NW 92a. The first and second nt_n regions are formed by hard-masking when performing ion implantation to form the NW and PW regions, such that the nt_n regions do not receive the well implants. In this way, the first and second nt_n regions have "native doping" levels similar to doping levels of the nt_n regions prior to formation of the first and second PW 94a and 94b and the first NW 92a. In the illustrated embodiment, the "native doping" level corresponds to the doping level of the nt_n regions after forming the DNW 90.

Referring to FIGS. 5A and 5B, the first NW 92a, the first nt_n 96b, and the second nt_n 96a are configured to form a base of the bidirectional PNP bipolar transistor 142. In addition, the second PW 94b is configured to form a collector/emitter of the bidirectional PNP bipolar transistor. Additionally, the first PW 94a is configured to form an emitter/collector (E/C) of the bidirectional PNP bipolar transistor 142 and the second PW 94b is configured to form a collector/emitter (C/E) of the bidirectional PNP bipolar transistor 142. In this configuration, the DNW 90 surrounds the bidirectional PNP bipolar transistor 142.

Referring to FIG. 5A, the analog switch with high bipolar blocking voltage further comprises a first n-type active (N+) region 97a disposed in the first PW 94a and a second n-type active (N+) region 97b disposed in the second PW 94b. The first and second N+ regions 97a and 97b are separated by an isolation 99. The first N+ region 97a is separated from the first P+ region 98a and the second N+ region 97b and the second P+ region 98b are each separated by isolations 99. Referring to FIGS. 5A and 5B, the first N+ region 97a, the first PW 94a, and the DNW 90 are configured to form an emitter, a base, and a collector of a first NPN bipolar transistor 146. The first terminal 206 is connected to the base of the first NPN bipolar transistor 146 through a first P+ region 98a and a first resistor 150 and further connected to the emitter of the first NPN bipolar transistor 146 through a first N+ region 97a. In addition, the second N+ region 97b, the second PW 94b, and the DNW 90 are configured to form an emitter, a base, and a collector of a second NPN bipolar transistor 144. The second terminal 208 is connected to the base of the second NPN bipolar transistor 144 through a second P+ region 98b and a second resistor 152 and further connected to the collector of the second NPN bipolar transistor 144 through a second N+ region 97b According to one embodiment, the first NPN bipolar transistor 146, the bidirectional PNP bipolar transistor 142, and the second NPN bipolar transistor 144 are configured to form an NPNPN bidirectional silicon-controlled rectifier (SCR). The E/C of the bidirectional PNP bipolar transistor 142 is electrically connected to the base of the first NPN bipolar transistor 146, the C/E of the bidirectional PNP bipolar transistor 142 is electrically connected to the base of the second NPN bipolar transistor 144, and the base of the bidirectional PNP bipolar transistor 142 is electrically connected to collectors of the first and second NPN bipolar transistors 146 and 144. The configuration provides a bidirectional high current shunt path responsive to an external transient electrical event which induces a voltage difference between the first and second terminals 106 and 108 that exceeds a certain critical value. The basic operation and the configuration of the NPNPN bidirectional silicon rectifier is similar to the analog switch 100 with high bipolar blocking voltage described earlier in connection with FIGS. 4A and 4B.

In particular, when a transient electrical event induces a voltage difference between the first and second terminals 206 and 208 greater than a certain threshold voltage, the NPNPN bidirectional SCR operates as a cross-coupled PNPN silicon-controlled rectifier (PNPN SCR) device in a substantially similar manner as described in FIGS. 4A and 4B. As described in connection with FIGS. 4A and 4B, the combination of the PNP bidirectional bipolar transistor 142 and the first NPN bipolar transistor 146 can operate as a first cross-coupled PNPN SCR and the combination of the PNP bidirectional bipolar transistor 142 and the second NPN bipolar transistor 144 can operate as a second cross-coupled PNPN SCR. In addition, the first and second cross-coupled PNPN SCRs can be turned on or "triggered" when a positive voltage signal is applied to the gate relative to the cathode of the second PNPN SCR in substantially similar manner as described above in connection with the PNPN SCRs in FIGS. 4A and 4B.

Still referring to FIGS. 5A and 5B, the analog switch 200 with high bipolar blocking voltage further comprises a first p-type active (P+) region 98a disposed in the first PW 94a and electrically connected to the base of the first NPN bipolar transistor 146 through a first resistor 150, and a second p-type active (P+) region 98b disposed in the second PW 94b and electrically connected to the base of second NPN bipolar transistor 144 through a second resistor 152. The first and second P+ regions 98a and 98b are separated from first and second N+ regions 97a and 97b, respectively, by isolations 99. The first resistor 150 is formed in the first PW 94a and the second resistor 152 is formed in the second PW 94b. The second PW 94b has a first side and a second side, where the first side of the second PW 94b is adjacent the second native n-type region 96a, and the analog switch 200 with high blocking voltage further comprises a second n-type well region (NW) 92c disposed on the second side of the second PW 94b. A fifth native n-type region (nt_n) 210a is interposed between the second PW 94b and second NW 92c. The first PW 94a has a first side and a second side, where the second side of the first PW 94a is adjacent the first native n-type region 210c, and the analog switch 200 with high bipolar blocking voltage further comprises a third n-type well region (NW) 92b disposed on the first side of the second PW 94b. A third native n-type region (nt_n) 210d is interposed between the first PW 94a and third NW 92b. The third NW 92b has a first side and a second side, where the second side of the third NW 92b region is adjacent the first PW 94a, and the analog switch 200 with high blocking voltage further comprises a third p-type well region (PW) 94c disposed on the first side of the third NW 92b. The third PW 94c has a first side and a second side, where the second side of the third PW 94c is adjacent the third NW 92b, and the analog switch 200 with high bipolar blocking voltage further comprises a fourth n-type well region (NW) 92d disposed on the first side of the third PW 94c. An eighth n-type active N+ region 97g is disposed in the fourth NW 92d and a fourth native n-type region (nt_n) 210e is interposed between the third PW 94c and the fourth NW 92d. The fourth NW 92d has a first side and a second side, where the second side of the fourth NW 92d is adjacent the third PW 94c, and the analog switch 200 with high bipolar blocking voltage further comprises a fourth p-type well region (PW) 94d disposed on the first side of the fourth NW 92d. A native p-type region (nt_p) 212a is interposed between the fourth NW 92d and the fourth PW 94d.

In the configuration of the analog switch 200 with high bipolar blocking voltage in FIG. 5A and 5B, the DNW 90 extends in the x-direction such that a first side of the DNW 90 is disposed between first and second sides of the fourth NW 92d and a second side of the DNW 90 is disposed between first and second sides of an eighth NW 92d' (not shown) on the opposite half of the analog switch 200 with high bipolar blocking voltage.

The analog switch 200 with high bipolar blocking voltage has first and second terminals 106 and 108 configured to receive a transient voltage signal. The first terminal 206 is connected to the first N+ region 97a and to the first P+ region 98a. The second terminal 208 is connected to the second N+ region 97b and to the second P+ region 98b. As discussed above, the analog switch 200 with high blocking voltage is configured to provide a high current shut path through the first NPN bipolar transistor 146, the bidirectional PNP bipolar transistor 142, and the second NPN bipolar transistor 144 configured to form a NPNPN bidirectional silicon-controlled rectifier (SCR). The NPNPN bidirectional SCR can be triggered in either voltage polarities because the combination of the PNP bidirectional bipolar transistor 142 and the first NPN bipolar transistor 146 can operate as a first cross-coupled PNPN SCR configured to be triggered by a first voltage polarity and the combination of the PNP bidirectional bipolar transistor 142 and the second NPN bipolar transistor 144 can operate as a second cross-coupled PNPN SCR configured to be triggered by a second voltage polarity.

Referring to FIG. 5B, in addition to the core NPNPN bidirectional SCR device, the analog switch 200 with high blocking voltage can include a parasitic PNP bipolar transistor 148. When the parasitic PNP bipolar transistor 148 is present, the fourth P+ region 98d, the fourth PW 94d, and the P-SUB 88 disposed below the fourth PW 94d and adjacent DNW 90 are configured to form an emitter of the parasitic PNP bipolar transistor 148. The emitter of the parasitic PNP bipolar transistor 148 is configured to be connected to the Kelvin connection at the fourth P+ region through a fourth resistor 156 formed in the P-SUB 88 and the fourth PW 94d. In addition, the deep n-type well 90 and the second PW 94b are configured to form a base and a collector of the parasitic PNP bipolar transistor 148.

As discussed above, the core NPNPN bidirectional SCR device of the analog switch 200 with high bipolar blocking voltage can be triggered, as an example, when a transient electrical event induces a positive voltage on the second terminal 208 relative to the first terminal 206. In addition, a parasitic PNPN SCR can provide an alternative current path in response to the transient electrical event. In the illustrated embodiment of FIG. 5B, the parasitic PNPN SCR includes the parasitic PNP bipolar transistor 148 and the second NPN bipolar transistor 144 arranged in a silicon-controlled rectifier (SCR) configuration. In particular, the collector of the parasitic PNP bipolar transistor 148 is connected to the base of the second NPN bipolar transistor 144 through a third resistor 154. In addition, the collector of the second NPN bipolar transistor 144 is connected to the base of the parasitic PNP bipolar transistor 148. Similar to the first and second PNPN SCRs described above, the first parasitic PNPN SCR can be triggered to enter into a regenerative feedback loop, for example, when the voltage difference between the second terminal 208 and the first Kelvin connection the fourth P+ region 94d at fourth P+ region 98d exceeds a trigger voltage +$V_{TR\ PARASITIC}$ of the parasitic PNPN SCR, which can cause the parasitic PNPN SCR to enter into a low impedance mode similar to that which occurs in the bipolar NPNPN. An increase in the collector current of the parasitic PNP bipolar transistor 148 increases the base current of the second NPN bipolar transistor 144 and an increase in the collector current of the second NPN bipolar transistor 144 increases the base current of the parasitic PNP bipolar transistor 148. Once in the low impedance state, the parasitic PNPN SCR can remain in the low impedance state until the positive voltage difference between the second terminal 208 and the Kelvin connection at the fourth P+ region 94d falls below +$V_{H\ PARA}$, or the current falls below +$I_{H\ PARA}$, or both.

In some embodiments, customizing the trigger voltages +/−$V_{TR}$ of the core NPNPN SCR device while having sufficient margin against +/−$V_{TR\ PARA}$ of parasitic PNPN SCRs, can be achieved through targeting lateral widths or the doping concentration of the native n-type and native p-type regions or both. Referring to FIGS. 5A and 5B, the native p-type region 212a, the first native n-type regions 210c, the second native n-type region 210b, the third native n-type regions 210d, the fourth native n-type region 210e, and fifth native n-type region 210a have sixth, third, second, fourth, fifth, and first widths $d_6$, $d_3$, $d_2$, $d_4$, $d_5$, and $d_1$, respectively. In one embodiment, each of the first to sixth widths $d_1$-$d_6$ can be less than about 5 μm. In another embodiment, each of the first to sixth widths $d_1$-$d_6$ can be between about 0.5 μm and about 2 μm, for instance about 1 μm.

In addition, the native p-type region 212a, the first native n-type regions 210c, the second native n-type region 210b, the third native n-type regions 210d, the fourth native n-type region 210e, and fifth native n-type region 210a of FIGS. 5A and 5B have first through sixth native doping concentrations. In one embodiment, each of the sixth native doping concentrations can be between about $1\times10^{13}$ cm$^{-3}$ and about $1\times10^{15}$ cm$^{-3}$, for instance about $5\times10^{14}$ cm$^{-3}$. In another embodiment, each of the first, second, third fourth and fifth native doping concentrations can be between about $1\times10^{14}$ cm$^{-3}$ and about $1\times10^{15}$ cm$^{-3}$, for instance about $6\times10^{14}$ cm$^{-3}$.

In addition, various P+ regions and N+ region have a peak doping concentration in the range of about $1\times10^{20}$ cm$^{-3}$ to about $8\times10^{20}$ cm$^{-3}$, for example, about $2\times10^{20}$ cm$^{-3}$. In addition, various PWs and NWs have a peak doping concentration in the range of about $1.5\times10^{16}$ cm$^{-3}$ to about $7.5\times10^{16}$ cm$^{-3}$, for example, about $5.0\times10^{16}$ cm$^{-3}$. Although various ranges of peak doping concentrations and depth have been described above, persons having ordinary skill in the art will readily ascertain other suitable doping concentrations.

FIG. 5C illustrates a plan-view image of the analog switch 200 with high bipolar blocking voltage illustrated in FIGS. 5A and 5B according to one embodiment. As discussed above, the analog switch 200 with high bipolar blocking voltage is mirror-symmetric about the plane of symmetry 202. While FIGS. 5A and 5B illustrated a cross-sectional view along the section 5A-5A of the left portion of the analog switch 200 with high bipolar blocking voltage, FIG. 5C illustrates the analog switch 200 with high bipolar blocking voltage at both sides of the plane of symmetry 202. For clarity, only well regions and native regions are illustrated.

On the left side of the plane of symmetry 202 in FIG. 5C, the analog switch 200 with high bipolar blocking voltage includes the fifth nt_n 210a and the second nt_n 210b forming vertical segments extending in the x-direction from first ends to second ends. The first ends and the second of the fifth nt_n 210a and the second nt_n 210b are connected by a first and second horizontal segments extending in the x-direction. In this manner, the first horizontal segment, the fifth nt_n 210a, the second horizontal segment, and the second nt_n 210b are continuously connected to form a first rectangular ring 222 enclosing the second PW 94b when viewing in a z-direction perpendicular to the surface of the analog switch 200 with high bipolar blocking voltage. In addition, the left side of the analog switch 200 with high bipolar blocking voltage additionally includes the first nt_n 210c and the third nt_n 210d forming vertical segments extending in the x-direction from first ends to second ends. The first ends and the second of the first nt_n 210c and the third nt_n 210d are connected by a third and fourth horizontal segments extending in the x-direction. In this manner, the third horizontal segment, the first nt_n 210c, the fourth horizontal segment, and the third nt_n 210d are continuously connected to form a second rectangular ring 224 enclosing the first PW 94a when viewing in a z-direction perpendicular to the surface of the analog switch 200 with high bipolar blocking voltage.

On the right side of the plane of symmetry 202 in FIG. 5C, the analog switch 200 with high bipolar blocking voltage includes the tenth nt_n 210a' and the seventh nt_n 210b' forming vertical segments extending in the x-direction from first ends to second ends. The first ends and the second of the tenth nt_n 210a' and the seventh nt_n 210b' are connected by a fifth and sixth horizontal segments extending in the x-direction. In this manner, the fifth horizontal segment, the tenth nt_n 210a', the sixth horizontal segment, and the seventh nt_n 210b' are continuously connected to form a third rectangular ring 226 enclosing the sixth PW 94a' when viewing in a z-direction perpendicular to the surface of the analog switch 200 with high bipolar blocking voltage. In addition, the right side of the analog switch 200 with high bipolar blocking voltage additionally includes the sixth nt_n 210c' and the eighth nt_n 210d' forming vertical segments extending in the x-direction from first ends to second ends. The first ends and the second ends of the sixth nt_n 210c' and the eighth nt_n 210d' are connected by a seventh and eighth horizontal segments extending in the x-direction. In this manner, the seventh horizontal segment, the sixth nt_n 210c, the eighth horizontal segment, and the eighth nt_n 210d' are continuously connected to form a fourth rectangular ring 228 enclosing the fifth PW 94b' when viewing in a z-direction perpendicular to the surface of the analog switch 200 with high bipolar blocking voltage.

The analog switch 200 with high bipolar blocking voltage additionally includes a first rectangular region 230 surrounding first through fourth rings 222, 224, 226, and 228. Except for the areas covered by first through fourth rings 222, 224, 226, and 228, and first, second, sixth, and fifth PWs 94a, 94b, 94a', and 94b', the rest of the area enclosed by the first rectangular region 230 forms n-wells such that the fifth NW 92c is disposed between second and third rings 224 and 226, the first NW 92a is disposed between first and second rings 222 and 224, and a fifth NW 92a' is disposed between third and fourth rings 226 and 228. In addition, third and sixth n-well regions 92b and 92b' are disposed adjacent third and eighth nt_n 210d and 210d'.

The analog switch 200 with high bipolar blocking voltage additionally includes a fifth ring formed by the fourth native n-type region 210e. The area bounded between an inner perimeter of the fourth n-type region 210e and the first rectangular region 230 forms a continuous ring of p-type well formed by the third p-well regions 94c. The analog switch 200 with high bipolar blocking voltage additionally includes a sixth ring formed by the native p-type region 212a. The area bounded between an inner perimeter of the native p-type region 212a and an outer perimeter of the fourth native n-type region 210e forms a continuous ring of n-well formed by the fourth NW 92d. The analog switch 200 with high bipolar blocking voltage additionally includes a fourth PW 94d surrounding the native p-type region 212a.

As described in connection with the cross-sectional view of FIGS. 5A and 5B, the first (PG) terminal 206a (not shown) electrically connects to the first PW 94a enclosed within the first ring 222. Although not shown for clarity, a third (PG) terminal 206a' electrically connects to the sixth PW 94a' enclosed within the fourth ring 228. In addition, the second (SIG) terminal 208a (not shown) electrically connects to the second PW 94b enclosed within the second ring 224. Although not shown for clarity, a fourth terminal 208a' electrically connects to the fifth PW 94b' enclosed within the third ring 226. In addition, the second and fourth terminals 208a and 208a' can be connected to form a single SIG terminal.

Figure 6A:
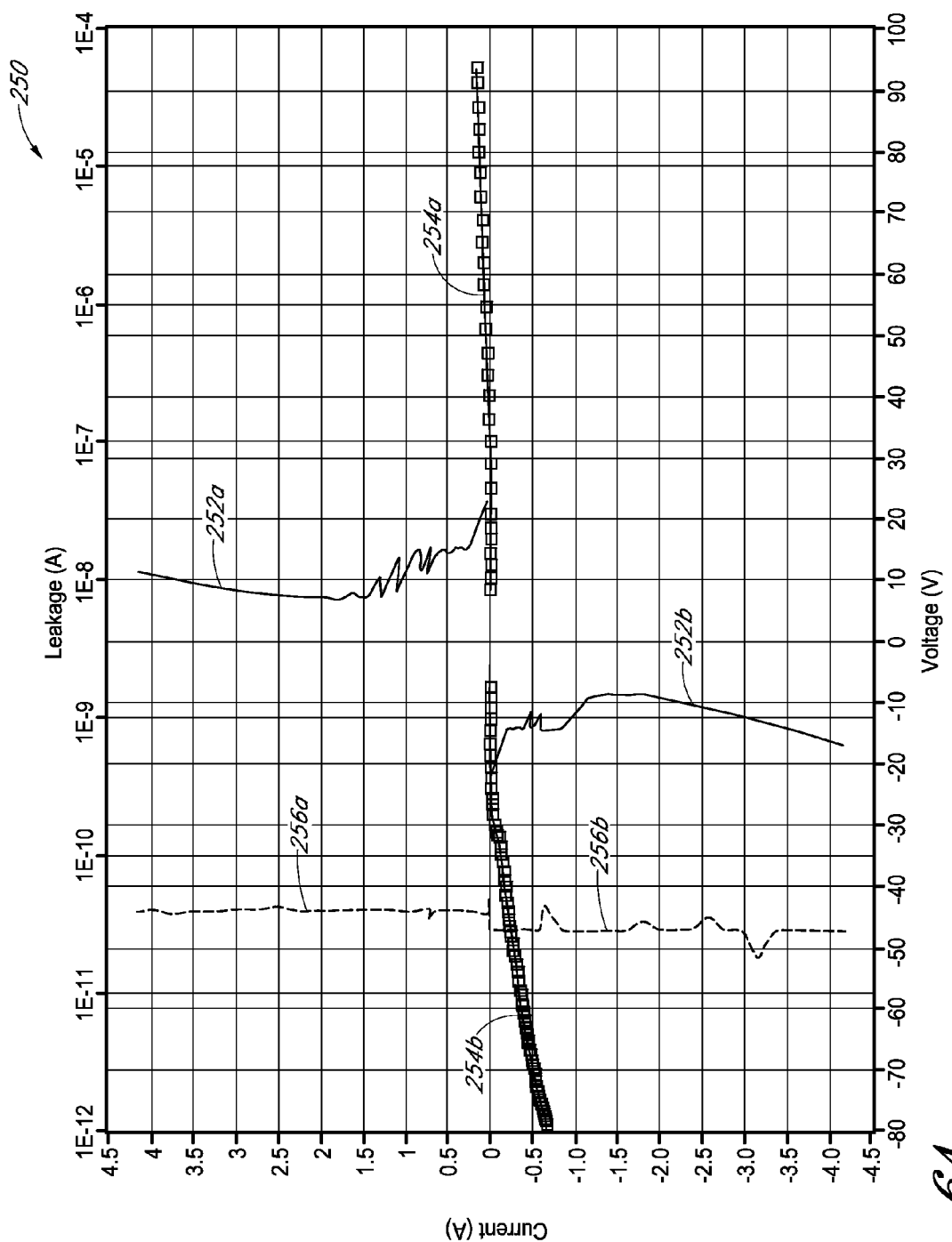
FIG. 6A is a graph of a pulsed current-voltage relationship and the corresponding leakage current measured from an analog switch with high bipolar blocking voltage according to one embodiment.

FIG. 6A illustrates testing lab results of the analog switch 200 with high bipolar blocking voltage illustrated in FIG. 5A-5C according to one example embodiment. In particular, in the illustrated embodiment, the first through firth nt_n widths $d_1$-$d_5$ and the nt_p width $d_6$ are about 1 μm. In this embodiment, the analog switch 200 with high bipolar blocking voltage has been designed to meet requirements of 4 kV human body model (HBM). The measurement configuration includes the first terminal 206 and the Kelvin connection at fourth PW 94d being connected to each other at Vss. The lower x-axis represents the transmission line pulsing (TLP) voltage applied between first and second terminals 206 and 208 and the y-axis represents the measured TLP current across the first and second terminals 206 and 208 in response to the applied voltage. The upper x-axis represents the measured leakage current at a leakage voltage, which is +/−20V in this example.

A positive pulsed I-V portion 252a and a negative pulsed I-V portion 252b of represent TLP current-voltage (I-V) characteristics of the analog switch 200 with high bipolar blocking voltage under opposite polarities. In particular, TLP I-V characteristics represent quasi-static TLP sweeps using 100 ns pulse widths and 2 ns rise time. The positive pulsed I-V portion 252a represents TLP I-V characteristic in response to a positive voltage stress on the second terminal 208 relative to the first terminal 206. The negative pulsed I-V portion 252b represents TLP I-V characteristics in response to a negative voltage stress on the second terminal 208 relative to the first terminal 206. In this example, for both positive and negative pulsed I-V sweeps, the analog switch 200 with high bipolar blocking voltage is configured to trigger at +/V$_{TR}$ of about +/−22 V, respectively. In addition, upon triggering, the illustrated analog switch 200 with high bipolar blocking voltage has holding voltages +/−V$_H$ of about 8V in both polarities.

A positive leakage I-V portion 256a and a negative leakage I-V portion 256b represent leakage current measured at +/−20V measured after a corresponding TLP pulse represented by the TLP current on the y-axis. A relatively unchanging leakage current level with increasing TLP pulse voltage indicates that the analog switch 200 with high bipolar blocking voltage is not damaged by the high voltage/current of the TLP pulse. As indicated, the leakage current remains stable and below 200 pA throughout the generation of the positive and negative pulsed I-V portions 252a and 252b, indicating device robustness at least up to +/−4.5 A.

A positive parasitic pulsed I-V portion 254a and a negative parasitic pulsed I-V portion 254b represent the parasitic bipolar pulsed current-voltage (I-V) characteristics of the analog switch 200 with high bipolar blocking voltage under opposite polarities. The parasitic pulsed I-V characteristics represent quasi-static TLP sweeps using 100 ns pulse widths and 2 ns rise time. The positive parasitic pulsed I-V portion 254a represents pulsed I-V characteristic in response to a positive voltage stress on the second terminal 208 relative to the Kelvin connection to substrate potential at Vss. The negative parasitic pulsed I-V portion 254b represents pulsed I-V characteristic in response to a negative voltage stress on the first terminal 206 relative to the Kelvin connection to substrate potential at Vss. The positive and negative parasitic pulsed I-V portions 254a and 254b in this example analog switch with high bipolar blocking voltage shows a high resistance conduction through the parasitic bipolar and that V$_{TR\ PARA}$ of the parasitic PNPN SCR device is well in excess of +/−V$_{TR}$ at +/−22V, which does not negatively impact the robustness of the analog switch 200 with high bipolar blocking voltage.

Figure 6C:
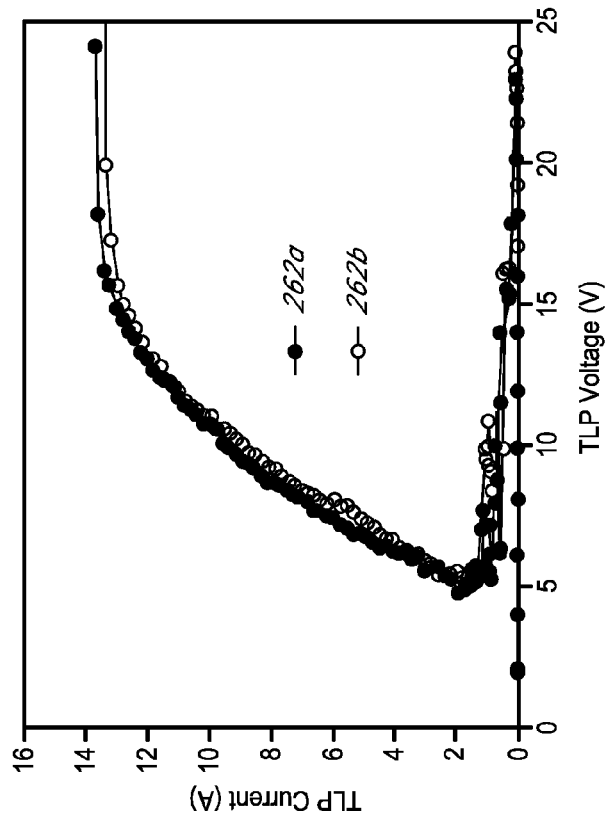
FIG. 6C is a graph of a pulsed current-voltage relationship measured from an analog switch with high bipolar blocking voltage according to one embodiment.
Figure 6B:
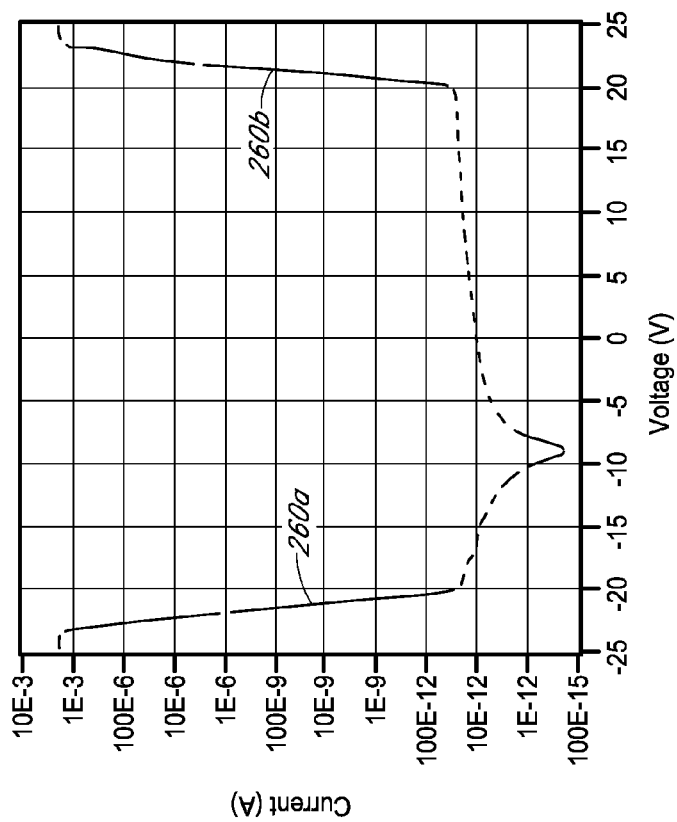
FIG. 6B is a graph of a DC sweep current-voltage relationship measured from an analog switch with high bipolar blocking voltage according to one embodiment.

FIG. 6B shows a low current DC current-voltage characteristics of the analog switch 200 with high bipolar blocking voltage of FIG. 5A measured at room temperature, according to one embodiment. The x-axis represents the voltage applied between the first and second terminals 206 and 208 and the y-axis represents the measured absolute current across the first and second terminals 206 and 208 in response to the applied voltage. A positive sweep portion 260b represent the current-voltage characteristics of the analog switch 200 with high bipolar blocking voltage in response to positive voltage stress on the second terminal 208 relative to the first terminal 206. A negative sweep portion 260a represent the current-voltage characteristics of the analog switch 200 with high bipolar blocking voltage in response to negative voltage stress on the second terminal 208 relative to the first terminal 206. As indicated by the low absolute current values (<1 nA) for both positive and negative sweeps, +/V$_{TR}$ of the core NPNPN bidirectional SCR device of the bidirectional device 200 has not been exceeded at +/−20 V. Similarly, the low absolute current values indicate that V$_{TR\ PARA}$ of the parasitic PNPN SCR device has not been exceeded at +/−20V.

FIG. 6C shows a quasi-static pulsed current-voltage characteristics (TLP) of the analog switch 200 with high bipolar blocking voltage illustrated in FIG. 6C measured at room temperature and designed for larger than 10,000 V HBM stress current handling capability, according to one embodiment. The x-axis represents the pulsed voltage applied between the first and second terminals 206 and 208 and the y-axis represents the measured absolute current across the first and second terminals 206 and 208 in response to the applied voltage. In this measurement configuration, the first terminal 206 and the Kelvin connection at 4$^{th}$ PW 94d are connected to each other at Vss. A positive pulsed I-V portion 262b represent the TLP characteristics of the analog switch 200 with high bipolar blocking voltage in response to positive voltage stress on the second terminal 208 relative to the first terminal 206. A negative pulsed I-V portion 262a represent the TLP characteristics of the analog switch 200 with high bipolar blocking voltage in response to negative voltage stress on the second terminal 208 relative to the first terminal 206. For both positive and negative sweeps, the analog switch 200 with high bipolar blocking voltage is configured to trigger at +/V$_{TR}$ of about +/−24 V. In addition, the symmetry of the positive and negative sweeps indicates that V$_{TR\ PARA}$ of the parasitic PNPN SCR device has not been exceeded at +/−25V. Upon triggering, the analog switch 200 with high bipolar blocking voltage has holding voltages +/−V$_H$ of about 5V in both polarities.

Figure 7A:
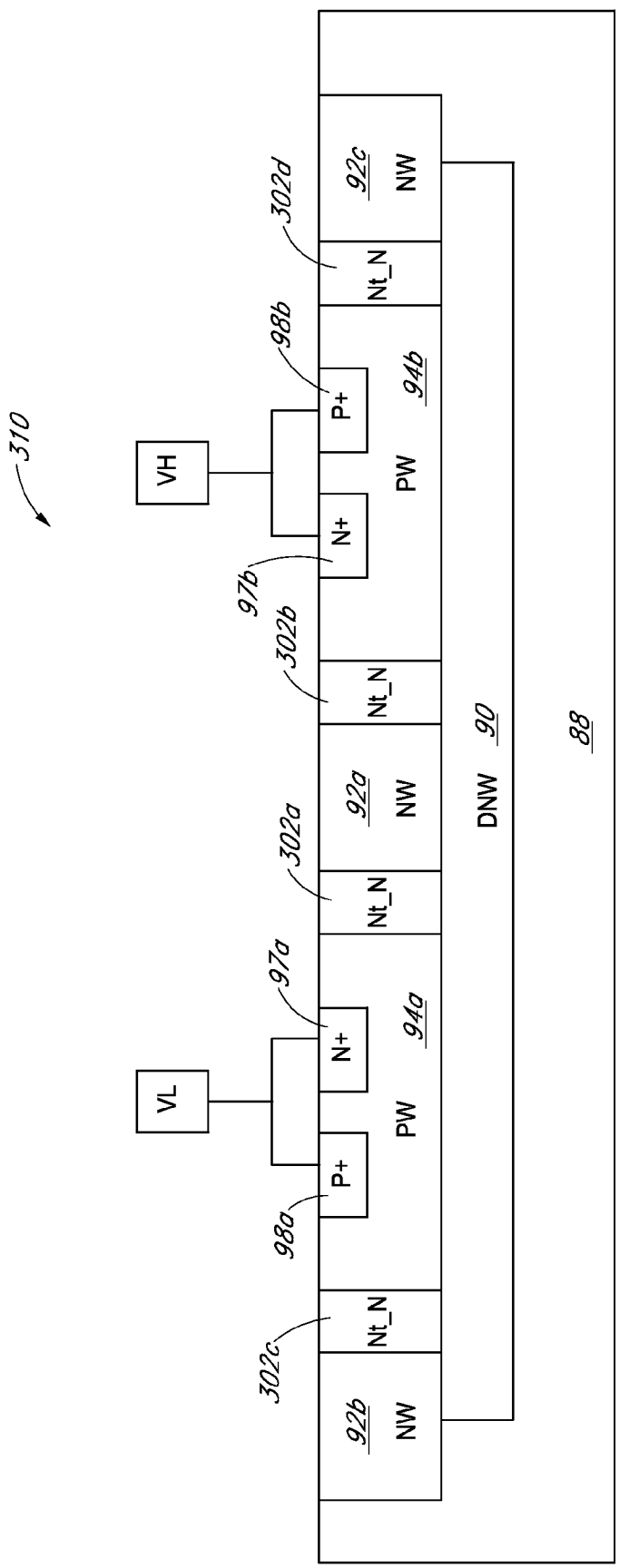
FIG. 7A is a cross-sectional view of an analog switch with high bipolar blocking voltage according to one embodiment.
Figure 7B:
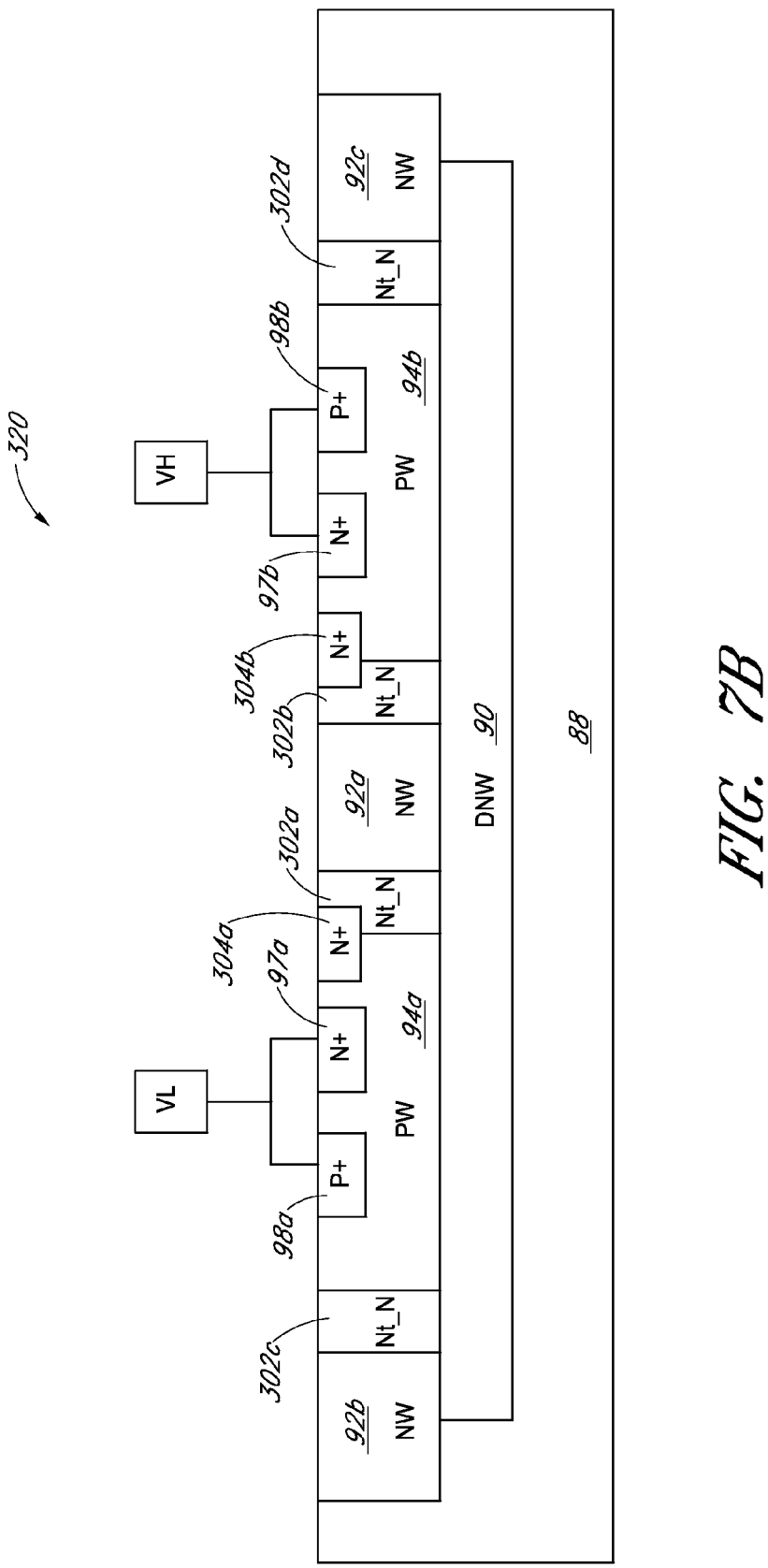
FIG. 7B is a cross-sectional view of an analog switch with high bipolar blocking voltage according to another embodiment.
Figure 7C:
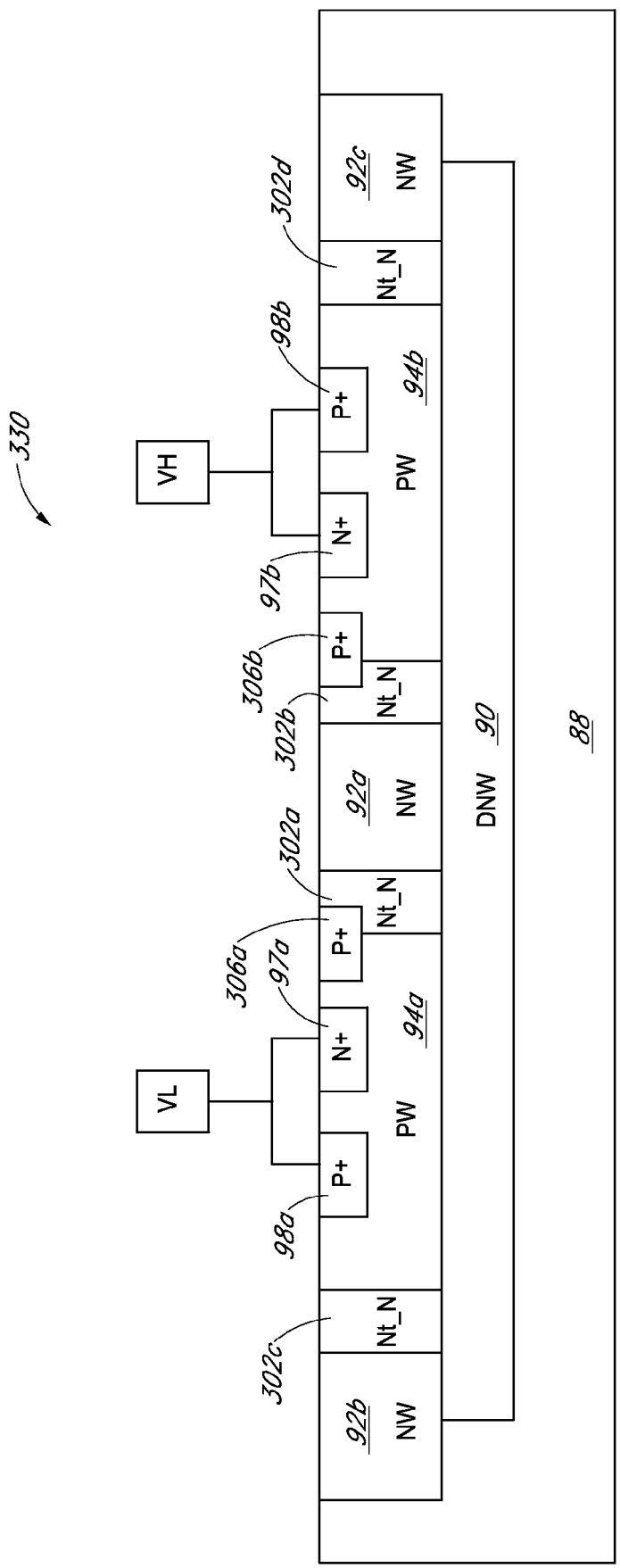
FIG. 7C is a cross-sectional view of an analog switch with high bipolar blocking voltage according to another embodiment.

FIGS. 7A to 7C illustrate analog switches with high bipolar blocking voltage according to additional embodiments. In addition to the native n-type and native p-type regions, placement of active regions at various locations can also result in additional customization of the device parameters such as $V_{TR}$. In FIGS. 7A to 7C, some details such as isolation regions have been left out for clarity.

FIGS. 7A to 7C illustrate analog switches with high bipolar blocking voltage 310, 320, and 330, respectively. Each of the analog switches with high bipolar blocking voltage 310, 320, and 330 include a p-type substrate (P-SUB) 88 and a deep n-well region (DNW) 90 formed within the P-SUB 88. The analog switches with high bipolar blocking voltage 310, 320, and 330 comprise a first p-type well region (PW) 94a, a second p-type well region (PW) 94b, and a first n-type well region (NW) 92a disposed between the first and second p-type well regions. The first p-type well region (PW) 94a, the second p-type well region PW 94b, and the first n-type well region (NW) 92a are formed in the DNW 90. The first NW 92a is disposed between the first and second PWs 94a and 94b.

The analog switches with high bipolar blocking voltage 310, 320, and 330 additionally include a first native n-type region (nt_n) 302a interposed between the first PW 94a and the first NW 92a and a second native n-type region (nt_n) 302b interposed between the second PW 94b and the first NW 92a. The nt_n regions are formed by similar methods and have similar doping levels as discussed above in connection with FIGS. 5A.

The analog switches with high bipolar blocking voltage 310, 320, and 330 comprise the first NW 92a, the first nt_n 96b, and the second nt_n 96a that are configured to form a base of a bidirectional PNP bipolar transistor. In addition, the second PW 94b is configured to form a collector/emitter of the bidirectional PNP bipolar transistor. Additionally, the first PW 94a is configured to form an emitter/collector (E/C) of the bidirectional PNP bipolar transistor and the second PW 94b is configured to form a collector/emitter (C/E) of the bidirectional PNP bipolar transistor. The DNW 90 surrounds the bidirectional PNP bipolar transistor. Also similar to FIGS. 5A and 5B, analog switches with high bipolar blocking voltage 310, 320, and 330 further comprises a first n-type active (N+) region 97a disposed in the first PW 94a and a second n-type active (N+) region 97b disposed in the second PW 94b. The first N+ region 97a, the first PW 94a, and the DNW 90 are configured to form an emitter, a base, and a collector of a first NPN bipolar transistor. The first terminal VL is connected to the base of the first NPN bipolar transistor through a first P+ region 98a and further connected to the emitter of the first NPN bipolar transistor through a first N+ region 97a. In addition, the second N+ region 97b, the second PW 94b, and the DNW 90 are configured to form an emitter, a base, and a collector of a second NPN bipolar transistor. The second terminal VH is connected to the base of the second NPN bipolar transistor through a second P+ region 98b and further connected to the collector of the second NPN bipolar transistor through a second N+ region 97b. The analog switches with high bipolar blocking voltage 310, 320, and 330 further comprise third and fourth native n-type regions (nt_n) 302c and 302d adjacent first PW 94a and second PW 94b, respectively. The analog switches with high bipolar blocking voltage 310, 320, and 330 further comprise second and third n-type well regions NW 92c and 92b disposed adjacent fourth and third native n-type regions 302d and 302c, respectively, such that the third nt_n 302c interposes the second NW 92b and the first PW 94a, and the fourth nt_n 302d interposes the second PW 94b and the third NW 92c.

The analog switch 320 with high bipolar blocking voltage of FIG. 7B is similar to the analog switch 310 with high bipolar blocking voltage, except that the analog switch 320 with high bipolar blocking voltage additionally includes a third n-type active (N+) region 304a formed partially in the first PW 94a and partially in the first nt_n 302a and a fourth n-type active (N+) region 304b formed partially in the second PW 94b and partially in the second nt_n 302b.

The analog switch 330 with high bipolar blocking voltage of FIG. 7C is similar to the analog switch 310 with high bipolar blocking voltage, except that the analog switch 330 with high bipolar blocking voltage additionally includes a third p-type active (P+) region 306a formed partially in the first PW 94a and partially in the first nt_n 302a and a fourth p-type active (P+) region 306b formed partially in the second PW 94b and partially in the second nt_n 302b.

According to embodiments, the configuration of the analog switch 320 with high bipolar blocking voltage of FIG. 7B can have trigger voltage $V_{TR}$ levels that are lower than the configuration of the analog switch 310 with high bipolar blocking voltage of FIG. 7A and the analog switch 330 with high bipolar blocking voltage of FIG. 7C. The configuration of the analog switch 330 with high bipolar blocking voltage of FIG. 7C can have trigger voltage $V_{TR}$ levels that are higher than the configuration of the analog switch 320 with high bipolar blocking voltage of FIG. 7B but lower than the configuration of the analog switch 330 with high bipolar blocking voltage of FIG. 7C. The configuration of the analog switch 310 with high bipolar blocking voltage of FIG. 7A can have trigger voltage $V_{TR}$ levels that are higher than the configuration of the analog switch 320 with high bipolar blocking voltage of FIG. 7B and higher than the configuration of the analog switch 330 with high bipolar blocking voltage of FIG. 7C.

Devices employing the above described protection schemes can be implemented into various electronic devices and interface applications. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, a mobile phone, a telephone, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus for protection against transient electrical events, comprising:
 a p-type substrate;
 a deep n-type well region formed in the p-type substrate and contacting the p-type substrate at a boundary facing away from and extending parallel to a main surface of the p-type substrate;
 a first p-type well region, a second p-type well region, and a first n-type well region disposed between the first and second p-type well regions, wherein the first n-type well region has an isolation region formed in at least a central portion therein, and wherein each of the first p-type well region, the second p-type well region, and the first n-type well region is formed within the deep n-type well region such that the deep n-type well continuously extends between the first and second p-type well regions;
 a first native n-type region disposed between the first p-type well region and the first n-type well region; and
 a second native n-type region disposed between the second p-type well region and the first n-type well region,
 wherein the first and second native n-type regions contact the first n-type well region,
 wherein the first p-type well region is configured as an emitter/collector of a bidirectional PNP bipolar transistor,
 wherein the first native n-type region, the first n-type well region, and the second native n-type region are configured as a base of the bidirectional PNP bipolar transistor, and
 wherein the second p-type well region is configured as a collector/emitter of the bidirectional PNP bipolar transistor.

2. The apparatus of claim 1, wherein the first native n-type region, the first n-type well region, and the second native n-type region are configured to form a buffer N-/N/N-base of the bidirectional PNP bipolar transistor.

3. The apparatus of claim 1, wherein the first native n-type region has a first native region width and the second native n-type region has a second native region width, the first and second native region widths being in the range between about 0.5 µm and about 2 µm.

4. The apparatus of claim 3, wherein the first native region width is substantially different from the second native region width.

5. The apparatus of claim 1, further comprising:
 a first n-type active region disposed in the first p-type well region,
  wherein the first n-type active region, the first p-type well region, and the deep n-type well region are configured as an emitter, a base, and a collector of a first NPN bipolar transistor; and
 a second n-type active region disposed in the second p-type well region,
  wherein the second n-type active region, the second p-type well region, and the deep n-type well region are configured as an emitter, a base, and a collector of a second NPN bipolar transistor.

6. The apparatus of claim 5, wherein the emitter/collector of the bidirectional PNP bipolar transistor is electrically connected to the base of the first NPN bipolar transistor, the collector/emitter of the bidirectional PNP bipolar transistor is electrically connected to the base of the second NPN bipolar transistor, and the base of the bidirectional PNP bipolar transistor is electrically connected to collectors of the first and second NPN bipolar transistors, such that the first NPN bipolar transistor, the bidirectional PNP bipolar transistor, and the second NPN bipolar transistor are configured as an NPNPN bidirectional semiconductor device.

7. The apparatus of claim 6, further comprising a first p-type active region disposed in the first p-type well region and electrically connected to the base of the first NPN bipolar transistor, and a second p-type active region disposed in the second p-type well region and electrically connected to the base of second NPN bipolar transistor.

8. The apparatus of claim 7, further comprising a first resistor formed in the first p-well region, wherein the first p-type active region is connected to the base of the first NPN bipolar transistor through the first resistor, further comprising a second resistor formed in the second p-well region, wherein the second p-type active region is connected to the base of second NPN bipolar transistor through the second resistor.

9. The apparatus of claim 7, wherein the second p-type well region has a first side and a second side, wherein the first side of the second p-type well region is adjacent the second native n-type region, the apparatus further comprising a second n-type well region disposed on the second side of the second p-type well region.

10. The apparatus of claim 9, wherein the first p-type well region has a first side and a second side, wherein the second side of the second p-type well region is adjacent the first native n-type region, the apparatus further comprising a third n-type well region disposed on the first side of the first p-type well region.

11. The apparatus of claim 10, wherein the third n-type well region has a first side and a second side, wherein the second side of the third n-type well region is adjacent the first p-type well region, the apparatus further comprising a third p-type well region disposed on the first side of the third n-type well region.

12. The apparatus of claim 11, further comprising a third native n-type region interposed between the third n-type well region and the third p-type well region.

13. The apparatus of claim 12, wherein the third p-type well region, the deep n-type well, and the second p-type well region are configured as a parasitic PNP bipolar transistor.

14. The apparatus of claim 11, further comprising a third native n-type region interposed between the third n-type well region and the first p-type well region.

15. The apparatus of claim 14, wherein the third p-type well region has a first side and a second side, wherein the second side of the third p-type well region is adjacent the third n-type well, the apparatus further comprising a fourth n-type well region disposed on the first side of the third p-type well region.

16. The apparatus of claim 15, further comprising a fourth native n-type region interposed between the fourth n-type well region and the third p-type well region.

17. The apparatus of claim 16, wherein the fourth n-type well region has a first side and a second side, wherein the second side of the fourth n-type well region is adjacent the fourth native n-type region, the apparatus further comprising a fourth p-type well region disposed on the first side of the fourth n-type well region.

18. The apparatus of claim 17, further comprising a fifth native n-type region interposed between the second p-type well region and the second n-type well region.

19. The apparatus of claim 18, further comprising a first native p-type region interposed between the fifth p-type well region and the fourth n-type well region.

20. The apparatus of claim 19, wherein the fourth p-type well region, the deep n-type well region, and the second p-type well region are configured to form an emitter, a base, and a collector of a parasitic bidirectional PNP bipolar transistor.

21. The apparatus of claim 20, wherein the fifth native n-type region and the second n-type region are connected to form a first ring enclosing the second p-type well region when viewed from a direction perpendicular to a first surface of the p-type substrate.

22. The apparatus of claim 21, wherein the first native n-type region and the third n-type region are connected to form a second ring enclosing the first p-type well region when viewed from a direction perpendicular to a first surface of the p-type substrate.

23. The apparatus of claim 22, wherein the fourth native n-type region forms a third ring enclosing first and second rings.

24. The apparatus of claim 1, wherein the first and second native n-type regions have dopant concentration in the range between about $1 \times 10^{14}$ cm$^{-3}$ and about $1 \times 10^{15}$ cm$^{-3}$.

25. The apparatus of claim 1, further comprising a pair of n-type active regions each formed at least partially in the first n-type well region and interposed by the isolation region.

\* \* \* \* \*